US008806149B2

(12) United States Patent
Yamada

(10) Patent No.: US 8,806,149 B2
(45) Date of Patent: Aug. 12, 2014

(54) LOGIC VERIFYING APPARATUS, AND COMPUTER-READABLE RECORDING MEDIUM IN WHICH LOGIC VERIFYING PROGRAM IS STORED

(75) Inventor: Kazuhira Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 574 days.

(21) Appl. No.: 13/106,662

(22) Filed: May 12, 2011

(65) Prior Publication Data

US 2012/0047335 A1 Feb. 23, 2012

(30) Foreign Application Priority Data

Aug. 19, 2010 (JP) ................................ 2010-183899

(51) Int. Cl.
*G06F 13/00* (2006.01)
(52) U.S. Cl.
USPC ........................................................ 711/154
(58) Field of Classification Search
USPC ...................... 716/4, 111; 711/154
See application file for complete search history.

(56) References Cited

U.S. PATENT DOCUMENTS

| 2003/0088808 | A1* | 5/2003 | Phelps et al. ................ 714/25 |
| 2003/0110477 | A1* | 6/2003 | Wakabayashi et al. ....... 717/135 |
| 2007/0260823 | A1* | 11/2007 | Dickinson et al. ............ 711/153 |
| 2007/0271533 | A1* | 11/2007 | Kitazawa .................... 716/4 |
| 2008/0126604 | A1* | 5/2008 | Kim et al. .................... 710/22 |
| 2008/0172551 | A1* | 7/2008 | Yamashita et al. ............ 712/227 |
| 2010/0017656 | A1* | 1/2010 | Park et al. .................... 714/27 |

FOREIGN PATENT DOCUMENTS

JP 1-243136 9/1989

OTHER PUBLICATIONS

Hoshiai, Takashige, "Approximate Analysis of Memory and Bus Contention in a Tightly Coupled Multiprocessor System," IEICE Transactions (J75-D1), No. 8, The Institute of Electronics, Information and Communication Engineers (IEICE), Aug. 25, 1992, vol. J75-D-I, pp. 664-674, with Partial English-language Translation of the Japanese Office Action.
Japanese Office Action mailed Nov. 12, 2013 for corresponding Japanese Application No. 2010-183899, with Partial English-language Translation.

* cited by examiner

*Primary Examiner* — April Y Blair
*Assistant Examiner* — Trang Ta
(74) *Attorney, Agent, or Firm* — Fujitsu Patent Center

(57) ABSTRACT

A logic verifying apparatus includes a second processor corresponding to a first processor to be verified; and one or more second controllers corresponding to first controllers to be verified, the number of which is less than that of the first controllers, control a second access to a memory, the access being made by the second processor, the second processor and the second controllers serving as elements in the verification model. The second processor includes a storing unit that stores information that assigns one or more of the second controllers that is to be used as the verification model; and a converting unit that converts a first address into a second address, the first address indicating an entity that the second processor is to access through the one second controller assigned by the information stored in the storing unit such that the second processor access to the memory.

18 Claims, 15 Drawing Sheets

1 : USED
0 : NOT USED

| No. | ADDRESS OF MEMORY WHOSE BIT IS FIXED | | SELECTED CONTROLLER | | | |
|---|---|---|---|---|---|---|
| | BIT 7 | BIT 6 | CONTROLLER 3-1 | CONTROLLER 3-2 | CONTROLLER 3-3 | CONTROLLER 3-4 |
| 1 | NOT FIXED (VALUE ORIGINALLY SET IN BIT 7) | FIXED TO "0" | 1 | 0 | 1 | 0 |
| 2 | NOT FIXED (VALUE ORIGINALLY SET IN BIT 7) | FIXED TO "1" | 0 | 1 | 0 | 1 |
| 3 | FIXED TO "0" | NOT FIXED (VALUE ORIGINALLY SET IN BIT 6) | 1 | 1 | 0 | 0 |
| 4 | FIXED TO "1" | NOT FIXED (VALUE ORIGINALLY SET IN BIT 6) | 0 | 0 | 1 | 1 |
| 5-1 | IF VALUE ORIGINALLY SET IN BIT 6 OF MEMORY IS "0" FIXED TO "0" | | 1 | 0 | 0 | 1 |
| 5-2 | IF VALUE ORIGINALLY SET IN BIT 6 OF MEMORY IS "1" FIXED TO "1" | | 0 | 1 | 1 | 0 |
| 6-1 | IF VALUE ORIGINALLY SET IN BIT 6 OF MEMORY IS "1" FIXED TO "0" | | | 1 | 1 | |
| 6-2 | IF VALUE ORIGINALLY SET IN BIT 6 OF MEMORY IS "0" FIXED TO "1" | | 0 | | | 0 |

1 : USED
0 : NOT USED

LOGIC VERIFYING APPARATUS, AND COMPUTER-READABLE RECORDING MEDIUM IN WHICH LOGIC VERIFYING PROGRAM IS STORED

CROSS-REFERENCE TO RELATED APPLICATIONS

This application is based upon and claims the benefit of priority of the prior Japanese Patent Application No. 2010-183899, filed on Aug. 19, 2010, the entire contents of which are incorporated herein by reference.

FIELD

The embodiment discussed herein is a logic verification apparatus that verifies the logic of a system, and a computer-readable recording medium in which a logic verification program is recorded.

BACKGROUND

In a development of a computer system, a logic circuit is generally verified by logic simulation before a computer system is actually fabricated.

In order to develop a computer system of less failure, it is important to verify a logic circuit having the same configuration as an actual computer system to be fabricated. For the above, it is desired to create a verification model having the same configuration as the maximum configuration of the computer system can have.

Hereinafter, description will now be made, assuming that a verification model having the entire configuration of a computer system is formed on a large-scale simulator.

FIG. 13 is a block diagram illustrating an example of the configuration of a computer system on a simulator. As illustrated in FIG. 13, a computer system 100 (hereinafter simply called "system") includes CPUs (Central Processing Units) 200-1 and 200-2, controllers 300-1 through 300-4, memories 400-1 through 400-4, IO (Input Output) controller 500, and IO cards 600-1 and 600-2.

Hereinafter, reference numbers 200-1 and 200-2 are used for CPUs when one of the CPUs is specified, and an arbitrary CPU is represented by reference number 200; reference numbers 300-1 through 300-4 are used for controllers when one of the controllers is specified, and an arbitrary controller is represented by reference number 300; reference numbers 400-1 and 400-4 are used for memories when one of the memories is specified, and an arbitrary memory is represented by reference number 400; and reference numbers 600-1 and 600-2 are used for IO cards when one of the IO cards is specified, and an arbitrary IO card is represented by reference number 600.

The CPUs 200-1 and 200-2 each read a program stored in the respective memories or the like and carry out predetermined processing. Here, the CPUs 200-1 and 200-2 reads a logic verifying program from the respective memory 400 and carries out logical verification on the system 100. As the above, in a computer system, the CPU 200 processes instructions followed by reading and writing data into and from a memory 400 through fetching instructions, fetching data, and storing data.

The CPU 200-1 includes a calculating unit 210-1 and a selecting unit 250-1; and the CPU 200-2 includes a calculating unit 210-2 and a selecting unit 250-2.

The calculating units 210-1 and 210-2 carry out predetermined calculations exemplified by issuing instructions for accesses to the memories 400 and the IO cards 600. When the CPU 200-1 and 200-2 access the memories 400 and the IO cards 600, the selecting units 250-1 and 250-2 select routes through which accesses are output.

The controllers 300-1 through 300-4 each controls accesses from the CPUs 200 and the IO controllers 500 to the controllers 400. The controller 300 is exemplified by a system controller.

Here, in the system 100 illustrated in FIG. 13, the selecting units 250-1 is communicably connected to the controllers 300-1 through 300-4, and similarly the selecting units 250-2 is communicably connected to the controllers 300-1 through 300-4.

The controllers 300-1 through 300-4 are communicably connected to each other.

The memories 400-1 through 400-4 each includes storing region having an address uniquely defined in the system 100. When the CPU 200 is executing a program, the CPU 200 reads the program from the storing region and stores and extends data and programs on the storing region. An example of the memory 400 is a RAM (Random Access Memory).

The IO controller 500 controls access from the CPU 200 to the IO cards 600, and also controls access from the IO card 600 to the memories 400. The IO controller 500 includes an arbitration unit 510.

The IO controller 500 is connected to the controller 300-1 and accesses the memory 400-1, the memory 400-2 connected to the controller 300-2, the memory 400-3 connected to the controller 300-3, and the memory 400-4 connected to the controller 300-4 through the controller 300-1.

The arbitration unit 510 arbitrates accesses from a number of IO cards 600 and distributes access from the CPUs 200 or the like to either IO card 600-1 and 600-2.

The IO cards 600-1 and 600-2 each controls connection between the system 100 and an external device connected via an auxiliary unit or a LAN.

As the illustrated in example FIG. 13, the system 100 includes four controllers 300-1 through 300-4 connected to the memories 400-1 through 400-4, respectively.

Here, addresses of the memories 400-1 through 400-4 are interleaving controlled by the four controllers 300-1 through 300-4 with the intention of speeding up the accesses to the memories 400.

An address of an entity other than the memories 400 such as the IO controllers 500 is not interleaving controlled. Accordingly, an access from the CPU 200 to the IO controllers 500 is made from the selecting unit 250 through the controller 300-1.

The controller 300 carries out interleaving controlling by sequentially selecting four controllers 300-1 through 300-4 in units of a predetermined address width of the memories 400, e.g. in units of 64 bytes. Thereby, when the CPU 200 makes accesses to continuous addresses of the memories 400, the controllers 300-1 through 300-4 and the memories 400-1 through 400-4 connected to the respective controllers 300 are evenly used.

Namely, a number of controllers 300 and a number of memories 400 installed in the computer system are uniquely selected by the addresses of the memories 400.

FIG. 14 is a flow diagram illustrating a succession of procedural steps of general address processing performed by a CPU 200.

For example, as illustrated in FIG. 14, when the calculating unit 210 in the CPU 200 issues an access request to the memory 400, the calculating unit 210 generates an address of an access destination (step S101).

Next, selecting unit 250 judges whether the address of the access destination is an address of a memory 400 or an address of the IO controller 500. Then, the selecting unit 250 selects a controller through which the is sued access request is output. Namely, the selecting unit 250 selects one of the four controllers 300-1 through 300-4 connected to the CPU 200 through which the issued access request is output (step S102).

Thereby, if the access destination is an address of the memory 400-1, the CPU 200-1 makes an access through the controller 300-1 to the memory 400-1; if the access destination is an address of the memory 400-2, the CPU 200-1 makes an access through the controller 300-2 to the memory 400-2; if the access destination is an address of the memory 400-3, the CPU 200-1 makes an access through the controller 300-3 to the memory 400-3; and if the access destination is an address of the memory 400-4, the CPU 200-1 makes an access through the controller 300-4 to the memory 400-4. In contrast, if the access destination is an address of the IO controller 500, the CPU 200 makes an access through the controller 300-1 to the IO controller 500.

FIG. 15 is a flow diagram illustrating a succession of procedural steps of general address processing of the IO controller 500.

For example, as illustrated in FIG. 15, an access request is input from the IO card 600 into the IO controller 500. In other words, the IO card 600 generates an address that indicates an access destination, and outputs the generated address to the IO controller 500 (step S111).

Next, the arbitration unit 510 of the IO controller 500 arbitrates an access from the IO card 600 on the basis of the address of an access destination input from the IO card 600. Specifically, the IO card 600 from which an access request is to be issued is selected from the IO cards 600-1 and 600-2 (step S112).

Then, if the address of the access destination is an address of memory 400, the IO controller 500 makes an access to the address of the access destination through the controller 300-1 connected to the IO controller 500 (step S113).

Thereby, if the address of an access destination is an address of the memory 400-1, the IO controller 500 makes an access through the controller 300-1 to the memory 400-1; if the address of an access destination is an address of the memory 400-2, the IO controller 500 makes an access through the controllers 300-1 and 300-2 to the memory 400-2; if the address of an access destination is an address of the memory 400-3, the IO controller 500 makes an access through the controllers 300-1 and 300-3 to the memory 400-3; and if the address of an access destination is an address of the memory 400-4, the IO controller 500 makes an access through the controllers 300-1 and 300-4 to the memory 400-4.

Here, the address of the memory 400 uses a continuous region of several Kilobytes through several Megabytes in the instruction region and the data region. Furthermore, interleaving by the controller 300 spreads regions storing instructions and data that the memories 400 processes to all the controllers 300 in the computer system.

Accordingly, an access request from the CPU 200 or the IO controllers 500 to a memory 400 are output to all the controllers 300-1 through 300-4 uniquely selected by the addresses of the memories 400.

[Patent Document] Japanese Laid-Open Patent Publication No. HEI 01-243136

In recent years, since the degree of integration of a semiconductor increases due to development of finer processing, it is difficult to verify, decreasing the number of the overlooked verification models, whether a computer system correctly operates through logic simulation using verification models.

As illustrated above with reference to FIGS. 13 through 15, for development of a computer system of less fails, it is important to verify a logical circuit through logic simulation on the same configuration as the computer system to be developed. This desires a verification model having the maximum configuration of the computer system.

However, in accordance with the capacity increase of the logical circuit of a computer system resulting from improvement of finer semiconductors, the verification model of a large-scale computer system uses a simulator large in capacity and high in cost.

In the meantime, since a simulator can accommodate a limited capacity of a logic circuit, some verification models of a large-scale computer system exceed the capacity of a simulator so that verification may not be accomplished.

For example, a storing unit such as memory usually uses a continuous region of several Kilobyte through several Megabyte to store a test program and data for logic verification.

On the other hand, a computer system that interleaving controls the memories uniformly uses the respective controllers and the memories by sequentially selecting four controllers in units of a predetermined address width, for example, in units of 64 byte as described above with reference to FIG. 13.

As the above, in a computer system that interleaving controls the memories, a region of a memory is allocated to the respective controller in units of a predetermined address width.

In such a computer system, even if a verification model does not accommodate one of the controllers and one of the memories, the logic verification carries out interleaving control as the above. Accordingly, the region of a memory seen from a test program for logic verification does not have a region of a predetermined address width that is periodically assigned to the memory accommodated in the verification model, which makes the logical verification difficult.

As the above, it is preferable to generate verification model which covers all the combinations of controllers that perform interleaving control in order to ensure a continuous region of the memory.

However, in logic verification of a computer system, insufficient capacity of the simulation to accommodate all the combinations of controllers may unsuccessfully configure the verification model.

Conventionally, in the cases where it is difficult to create a verification model of a large-capacity computer system, the verification has been carried out by one of the following schemes (i) through (iii).

(i) preparing a larger-capacity simulator and carrying out verification;

(ii) reducing elements such as a CPU except for controllers, and creating a less-capacity model to verification; and (iii) creating an artificial circuit of a controller or the like to reduce the capacity, substituting the artificial circuit for the controller, and carrying out the verification.

However, in the above scheme (i), a larger-capacity simulator is determined, requiring an expensive simulator, which therefore raises the costs. Moreover, there may not be a simulator having a sufficient capacity to verify the configuration of a large-scale computer system.

In such a case, a possible solution is to create a verification model having the maximum configuration that the capacity of the simulator allows. However, if memories are interleaving controlled, a verification model preferably includes a number of controllers. Accordingly, in creating a verification model, since the number of controllers is not less than the minimum unit that constitutes the interleaving (system), so that a verification model may not be configured.

In the scheme (ii), when reducing elements such as a CPU except for controllers and creating a less-capacity model to verification, the omitted elements by the reduction are not verified, which makes the verification difficult to reduce the verification models that are overlooked.

In addition, a verification model is different in configuration from that of the computer system, which results in modifying the test program and thereby increases a number of steps in development.

In the scheme (iii), when creating an artificial circuit of a controller or the like to reduce the capacity and substituting the artificial circuit for the controller, an extra artificial circuit is created, which increases a number of steps in development.

Furthermore, the following problems arise.

A general logic verification scheme on a computer system concentrates access to a particular memory or diffusing accesses with the intention of improving verification coverage. In order to carryout this scheme, a large number of test programs are created for each address for which access is desired to be concentrated or diffused.

However, creation of such a large number of test programs increases the number of steps in development.

SUMMARY

There is provided a logic verifying apparatus for carrying out logic verification on a system including a first processor and a plurality of first controllers that control a first access that the first processor makes to a memory, the access being made by the first processor, using a verification model, the logic verifying apparatus including: a second processor corresponding to the first processor; and one or more second controllers corresponding to the first controllers, the number of which is less than that of the first controllers, control a second access to the memory, the access being made by the second processor, the second processor and the second controllers serving as elements in the verification model; the second processor including: a storing unit that stores information that assigns one or more of the second controllers that is to be used as the verification model; and a converting unit that converts a first address into a second address, the first address indicating an entity that the second processor is to access through the one second controller assigned by the information stored in the storing unit such that the second processor access the memory.

There is also provided a non-transitory, computer-readable recording medium in which a logic verifying program to instruct a computer to function as a logic verifying apparatus for carrying out logic verification on a system including a first processor and a plurality of first controllers that control a first access that the first processor makes to a memory, the access being made by the first processor, using a verification model, the logic verifying program instructing the computer to function as: a second processor corresponding to the first processor; and one or more second controllers corresponding to the first controllers, the number of which is less than that of the first controllers, controls a second access to the memory, the access being made by the second processor, the second processor and the second controllers serving as elements in the verification model; in instructing the computer to function as the second processor, the logic verifying program instructs the computer to function as: a storing unit that stores information that assigns one or more of the second controllers that is to be used as the verification model; and a converting unit that converts a first address into a second address, the first address indicating an entity that the second processor is to access through the one second controller assigned by the information stored in the storing unit such that the second processor access the memory.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a diagram illustrating combinations of controllers in logic verification through address conversion;

DESCRIPTION OF EMBODIMENT

Hereinafter, a first embodiment of the present invention will now be described with reference to the drawings.

Figure 1:
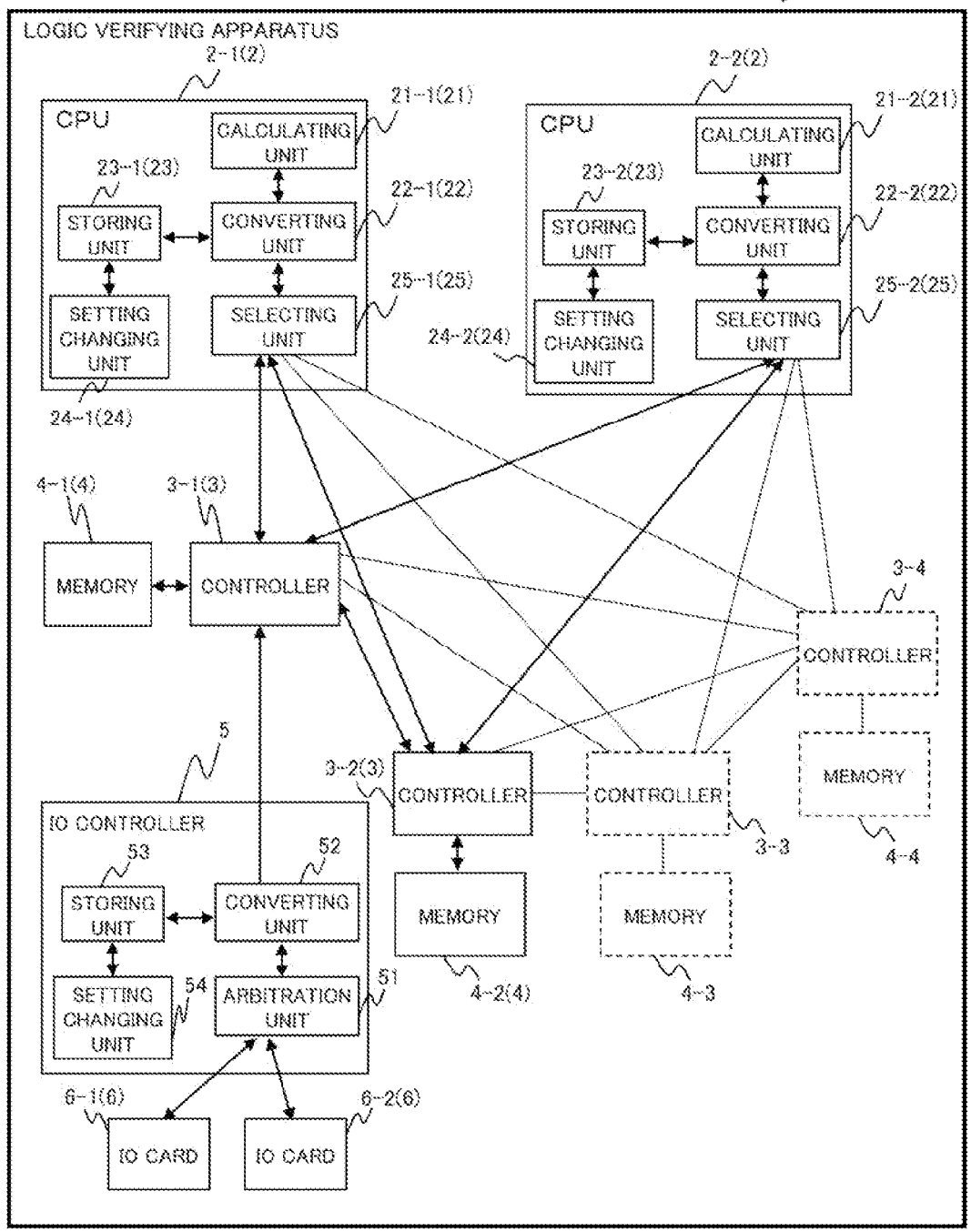
FIG. 1 is a block diagram schematically illustrating an example of the configuration of a logic verifying apparatus according to a first embodiment.

(A) First Embodiment (A-1) Configuration of a Logic Verifying Apparatus of the First Embodiment:

FIG. 1 is a block diagram schematically illustrating an example of the configuration of the logic verifying apparatus according to the first embodiment.

A logic verifying apparatus 1 carries out logic verification of a non-illustrated system to be verified through the use of a verification model. Here, the system to be verified includes processors to be verified, such as CPUs and IO controllers, and controllers to be verified, such as a number of system controllers that control accesses to memories such as RAMs by the processor to be verified.

The above logic verification is accomplished by creating a verification model by dedicated hardware, that is the logic verifying apparatus 1, and executing a test program containing various access patterns by a CPU of the dedicated hardware.

Alternatively, the logic verification may also be accomplished on software serving as a logic verifying program by formulating a verification model of the logic verifying apparatus 1 in a simulator and executing a test program containing various access patterns.

As illustrated in FIG. 1, the logic verifying apparatus 1 includes CPUs 2-1 and 2-2, controllers 3-1 and 3-2, memories 4-1 and 4-2, IO controller 5, an IO card 6-1 and 6-2 serving as elements in a verification model.

The controllers 3-3 and 3-4 and the memory 4-3 and 4-4, which are illustrated by broken lines in FIG. 1, can be included in a system to be verified along with the controllers 3-1 and 3-2 and the memories 4-1 and 4-2, but are not included in logic verifying apparatus 1 of the first embodiment.

Namely, the controllers 3 of a verification model correspond to controllers, but are less than the controllers to be verified.

Herein after, reference numbers 2-1 and 2-2 are used for CPUs when one of the CPUs is specified, and an arbitrary CPU is represented by reference number 2; reference numbers 3-1 and 3-2 are used for controllers when one of the controllers is specified, and an arbitrary controller is represented by reference number 3; reference numbers 4-1 and 4-2 are used for memories when one of the memories is specified, and an arbitrary memory is represented by reference number 4; and reference numbers 6-1 and 6-2 are used for IO cards when one of the IO cards is specified, and an arbitrary IO cards is represented by reference number 6.

The CPUs 2-1 and 2-2 each reads program stored in the respective memories or the like and carry out predetermined processing. Here, the CPUs 2-1 and 2-2 read a logic verifying program from the respective memory 4 and carries out logical verification on the logic verifying apparatus 1.

The CPU 2-1 includes a calculating unit 21-1, a converting unit 22-1, a storing unit 23-1, a setting changing unit 24-1, and a selecting unit 25-1; and similarly, the CPU 2-2 includes a calculating unit 21-2, a converting unit 22-2, a storing unit 23-2, a setting changing unit 24-2, and a selecting unit 25-2.

Hereinafter, reference numbers 21-1 and 21-2; 22-1 and 22-2; 23-1 and 23-2; 24-1 and 24-2; 25-1 and 25-2 are used for indicating certain one of the calculating units; the converting units; the storing units; the setting changing units; and the selecting units, respectively. Arbitrary calculating unit, converting unit, storing unit, setting changing unit, and selecting unit are represented by reference numbers 21, 22, 23, 24, and 25, respectively.

The calculating unit 21-1 and 21-2 each carries out predetermined calculating processing, and for example, issues an instruction to access the memory 4 or the IO card 6. The calculating unit 21 further carries out calculating processing to generate an address to indicate an object that the CPU 2 accesses in the logical verification.

The converting units 22-1 and 22-2 convert addresses (first addresses) which are generated by the corresponding calculating units 21-1 and 21-2 and which indicate entities that the CPU 2 accesses to second addresses. At that time, the converting unit 22 refers to information stored in the storing unit 23 to be detailed below, and converts the address to second addresses such that the CPU 2 causes the controller 3-1 or 3-2 assigned by the information to access the memory 4.

The specific manner of converting an address by the converting unit 22 will be detailed below.

The storing units 23-1 and 23-2 each stores information to be use for address conversion by the converting units 22-1 and 22-2, respectively.

The information stored in the storing unit 23 assigns one or more controllers 3 to be used in the verification model from the controllers 3-1 and 3-2, the number of which is less than that of controllers to be verified, and indicates association of the controllers to be verified with the controller 3, the number of which is less than that of the controllers to be verified.

Figure 2:
FIG. 2 is a diagram illustrating information stored in a storing unit of the first embodiment.

For example, the storing unit 23 stores information of a table T1 illustrated in FIG. 2 as the information to be used for addresses conversion by the converting unit 22 in the first embodiment.

FIG. 2 is a diagram illustrating an example of information stored in the storing unit 23.

Hereinafter, description to be made below assumes that the storing unit 23 stores information of the table T illustrated in FIG. 2.

The table T1 includes pieces of information as many as the maximum number of controllers to be verified that the system to be verified can accommodate. In the first embodiment, since the system to be verified can accommodate four controllers to be verified, the Table 1 includes four pieces of information corresponding to the controllers 3-1 through 3-4 illustrated in FIG. 1.

The table T1 indicates that the controllers 3-1 and 3-2 which are set to "1" are used in the verification model of the first embodiment. This means that the CPU 2 and the controller 5 can access the memories 4-1 and 4-2, which are connected to the controllers 3-1 and 3-2 to be used in the verification model of the first embodiment, respectively.

Conversely, the controllers 3-3 and 3-4 which are set to "0" in the Table T1 are controllers that are not used in the verification model of the first embodiment. This means that the CPU 2 and the IO controller 5 are not allowed to access to the memories 4-3 and 4-4, which are connected to the controllers 3-3 and 3-4, respectively.

The setting changing units 24-1 and 24-2 set and change the contents of the table T1 stored in the storing units 23-1 and 23-2, respectively.

Figure 6:
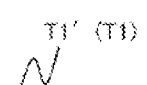
FIG. 6 is a diagram illustrating information stored in a storing unit of the first embodiment.

For example, when the storing units 23 stores the contents of the Table T1 of FIG. 2, the setting changing unit 24 changes the value "1" set for the controller 3-2 in the Table T1 to "0" set in a table T1' illustrated in FIG. 6.

Accordingly, in the logic verifying apparatus 1, the number of controllers 3 used in the verification model can be increased or decreased simply by the setting changing unit 24 changing the information stored in the storing unit 23.

The selecting units 25-1 and 25-2 select one controller from the controllers 3-1 and 3-2, which are assigned by information stored in the storing units 23-1 and 23-2, respectively, on the basis of addresses converted by the converting units 22-1 and 22-1, respectively. The selecting units 25-1 and 25-2 access to an address of the memories 4 converted by the converting units 22-1 and 22-1 through the selected controllers 3.

As the above, the selecting unit 25 selects a route through which the CPU 2 accesses the memory 4 or the IO card 6 on the basis of the information stored in the storing unit 23.

The controllers 3-1 and 3-2 control access from the CPU 2 and the IO controller 5 to the memories 4 and access from the CPU 2 to the IO controller 5. The controller 3 is exemplified by a system controller.

Here, in the logic verifying apparatus 1 of FIG. 1, the selecting unit 25-1 is communicably connected to the controllers 3-1 and 3-2; similarly, the selecting unit 25-2 is communicably connected to the controllers 3-1 and 3-2.

The controllers 3-1 and 3-2 are communicably connected to each other.

The controllers 3 correspond to controllers to be verified included in the system to be verified and the number of which is less than that of the controllers to be verified. Specifically, the verification model of the first embodiment includes two controllers 3-1 and 3-2, which is less by two than those of the system to be verified including four controllers to be verified.

The controller 3 interleaving controls access from the CPU 2 to the memory 4.

The interleaving control of the controller 3 will be detailed below.

The memories 4-1 and 4-2 each includes storing region identified by a unique address in the logic verifying apparatus 1. When the CPU 2 is executing a program, the CPU 2 reads the program from the storing region, and stores and extends data and programs on the storing region. An example of the memory 4 is a RAM.

In the first embodiment, the memories 4-1 and 4-2 are connected to the controllers 3-1 and 3-2, respectively, and receive access from the CPU 2 and the IO controller 5 through the connected controllers 3.

The IO controller 5 controls access from the IO cards 6 to the memories 4, and also controls access from the CPUs 2 to the IO cards 6. The IO controller 5 includes an arbitration unit 51, a converting unit 52, a storing unit 53, and a setting changing unit 54.

Specifically, the IO controller 5 is connected to the controller 3-1 and accesses, through the controller 3-1, the memory 4-1 and the memory 4-2 connected to the controller 3-2. Here, the IO controller 5 carries out logic verification on the logic verifying apparatus 1 by a test program executed in an external unit connected to the IO card 6.

As the above, the CPUs 2 and the IO controllers 5 carryout logical verification on the logic verifying apparatus 1 and can therefore be regarded as processors corresponding to the processors to be verified included in the system to be verified.

The IO cards 6-1 and 6-2 each carries out control to connect the IO controller 5 to external units such as another auxiliary memory or another device connected through a LAN.

The arbitration unit 51 arbitrates an access from at least one external device through the IO card 6-1 or 6-2. Specifically, the arbitration unit 51 arbitrates an access from an external device connected through the IO card 6 to the IO controller 5 on the basis of an address which is issued by the external device and which indicates an access destination that the external device is to access.

For example, upon input of access requests from the cards 6-1 and 6-2, the arbitration unit 51 selects an access request to be output to controller 3-1 from the two input access requests. Furthermore, the arbitration unit 51 judges whether an address indicating an access destination input from the card 6 is an address of the other IO card 6. For example, if an address indicating an access destination input from the card 6-1 is the address of the IO card 6-2, the arbitration unit 51 outputs access from the IO card 6-1 to the IO card 6-2.

The arbitration unit 51 distributes accesses from the CPUs 2 to the IO cards 6-1 and 6-2.

The converting unit 52 converts an address which is arbitrated by the arbitration unit 51 and which indicates an access destination to be accessed by the IO controller 5. The converting unit 52 refers to the information stored in the storing unit 53 to be detailed below, and converts the address such that the IO controller 5 can access a memory 4 through the controller 3-1 or 3-2 assigned by the referred information.

The specific manner of address conversion by the converting unit 52 will be detailed below in conjunction with the converting unit 22.

The storing unit 53 stores information used for address conversion similarly to the storing unit 23.

Hereinafter, description to be made assumes that the storing unit 53 stores the contents of the table T1 of FIG. 2 similarly to the storing unit 23.

The setting changing unit 54 sets and changes the contents of the table T1 stored in the storing unit 53.

The storing units 23 and 53, and the setting changing units 24 and 54 may be installed in all the CPU 2-1 and 2-2, and the IO controller 5, or a single storing unit and a single setting changing unit may be shared by the CPU 2-1 and 2-2, and the IO controller 5.

The storing units 23 and 53 may store the same information.

Note that the setting changing units 24 and 54 may be any means which set and change the setting by means of the hardware such as jumper pins. In this case, whether each of controllers 3-1 through 3-4 is used or not used as indicated by the Table 1 is judged by the short circuit position of the jumper pins, thereby the storing units 23 and 53 can be omitted.

As the above, the IO controller 5 accesses an address of a memory converted by the converting unit 52 through one of the controllers 3 assigned by the information stored in the storing unit 53.

(A-2) Processor and Controller of the First Embodiment:

Next, description will now be made in relation to the CPU 2 and the IO controller 5, serving as processors, and the controllers 3.

Figure 3:
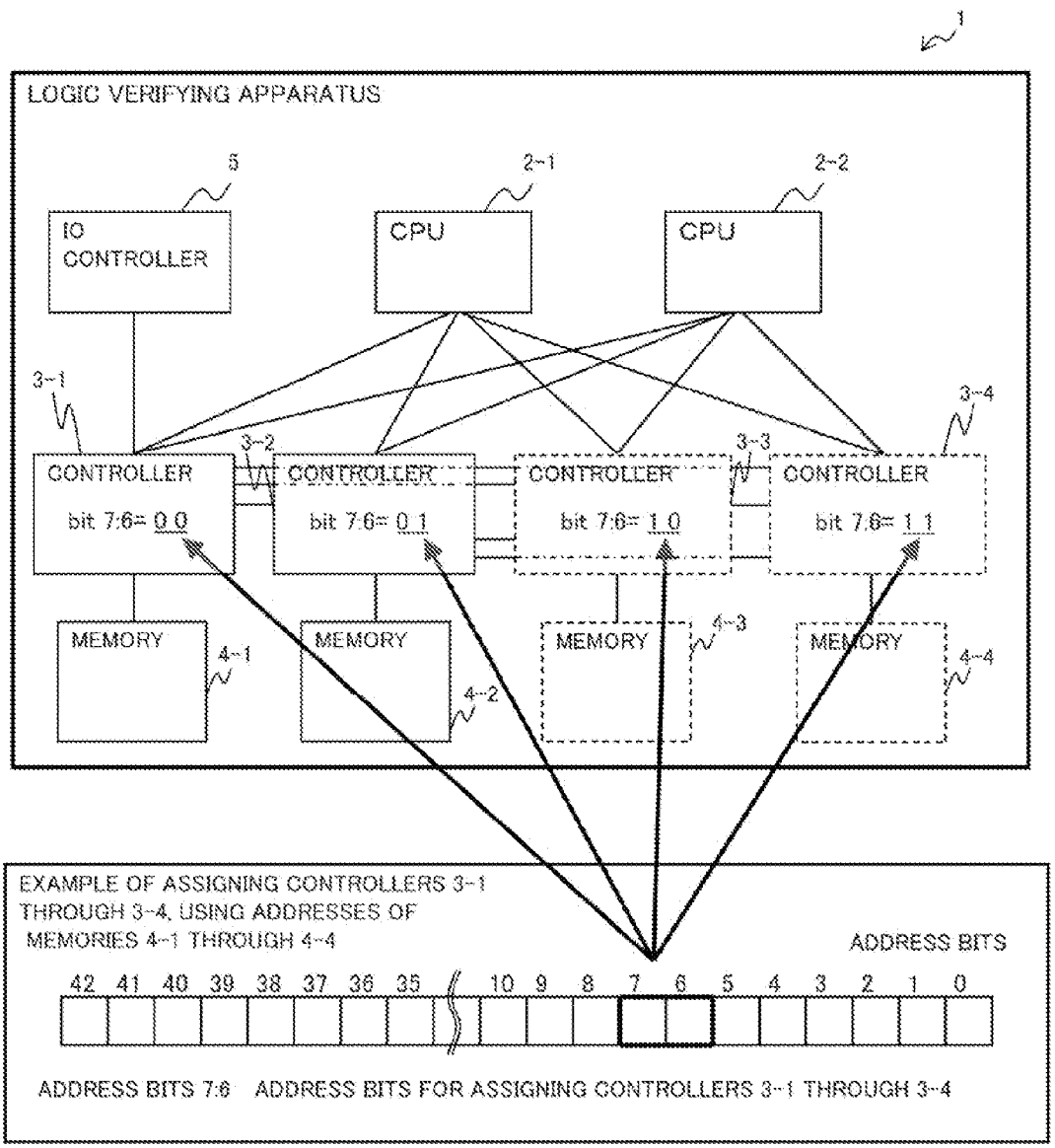
FIG. 3 is a diagram illustrating an example of assigning a controller through the use of an address of a memory.

For the convenience, part of the configuration of the logic verifying apparatus 1 is omitted in FIG. 3.

As illustrated in FIG. 3, the controllers 3 of the logic verifying apparatus 1 are indicated by the values of address bits 7:6 of the address of the memories 4. In other words, address bits 7:6 in the first embodiment serve as assigning address bits in an address indicating the access destination of the processors 2 and 5 are to access, and in particular the address bits recognize the controllers 3 to be accessed.

Specifically, in a case where the values of address bits 7:6 of an address that indicates an access destination that the CPU 2 and the IO controller 5 serving as processors are to access, that is an address of a memory in the system to be verified, being "00", the controller 3-1 of the logic verifying apparatus 1 is selected. In the same manner, when the values of address bits 7:6 being "01" then the controller 3-2 is selected; when the values of address bits 7:6 being "10" then the controller 3-3 is selected; and when the values of address bits 7:6 being "11" then the controller 3-4 is selected.

In the logic verifying apparatus 1, the processors 2 and 5 access to an access destination of the CPU 2 and the IO controller 5 through a controller 3 selected on the basis of an address indicating the access destination of the CPU 2 and the IO controllers 5 serving as the processors.

Here, as mentioned above, the logic verifying apparatus 1 accommodates the controllers 3-1 and 3-2, the number of which is less than that of the controllers to be verified.

Accordingly, as illustrated in FIG. 3, the logic verifying apparatus 1 does not accommodate the controllers 3-3 and 3-4 that are selected when the values of the assigning address bits that indicate an access destination of the processors 2 and 5 are to access, i.e., the address bits 7:6, are "10" and "11", respectively.

Figure 4:
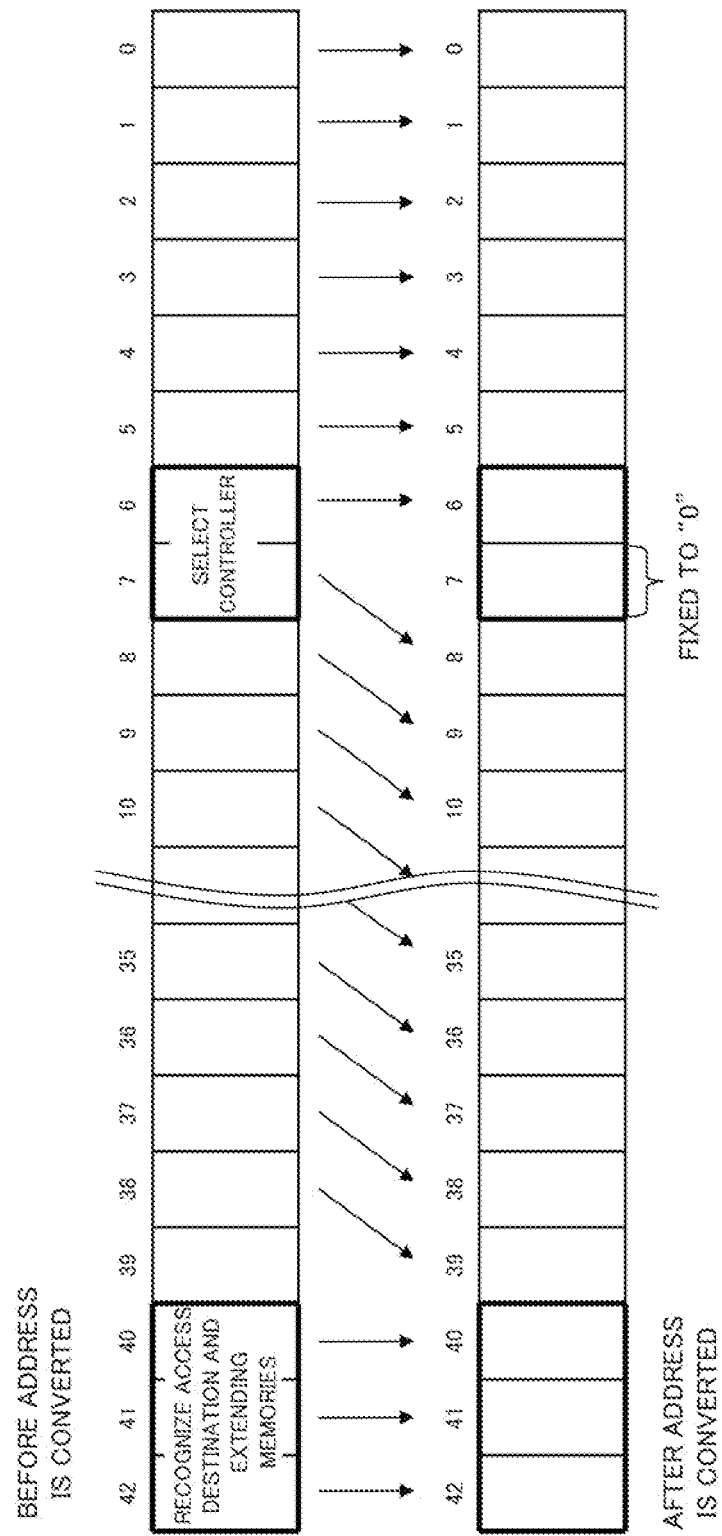
FIG. 4 is a diagram illustrating a method of converting an address by a converting unit when a storing unit stores the information of FIG. 2.

For the above, as illustrated in FIG. 4, the converting units 22 and 52 convert an address indicating an address destination that the processors 2 and 5 are to access, that is an address that selects one of the controllers 3-1 through 3-4, into an address that selects one of the controllers 3-1 and 3-2 accommodated in the logic verifying apparatus 1.

FIG. 4 is a diagram illustrating a method of address conversion by the converting units 22 and 52 when the information of FIG. 2 is stored by the storing units 23 and 53.

In FIG. 4, the upper address represents an address of an access destination before the converting units 22 and 52 convert the address, that is, an address indicates an access destination that the processors 2 and 5 are to access; and the lower address is an address of an access destination after the converting by the converting units 22 and 52.

In the addresses of FIG. 4, address bits 42:40 are bits that specifies an access to a memory 4 or the IO controller 5. The address bits 42:40 are also used for extending memories included in a system to be verified if the system is a large-scale system.

Here, an example of the large-scale system to be verified includes eight controllers to be verified and has two combinations of controllers to be verified each of which conducts interleaving control.

In the above case of extending memories, the address bits 42:40 are used for discriminating the two combinations of controllers each of which combinations carries out interleaving control from each other.

In addition, the address bits 39:0 are used as a unique address of a memory 4 in a single combination of interleaving controlling by controllers 3.

Hereinafter, description will now be made in relation to a method of address conversion an address by the converting units 22 and 52.

Upon input of an address of an access destination that the processors 2 and 5 are to access from the calculating unit 21 or an IO card 6, the converting units 22 and 52 judge whether the input address is the address of a memory 4 by referring one or more values set in predetermined positions in the address bits 42:40.

For example, when the value of address bit 42 is "1", the converting units 22 and 52 judge that the address is an address of a memory 4. In the meantime, when the value of address bit 42 is "0", the converting units 22 and 52 judge that the address of an access destination is an address of an entity other than the memories 4, for example an address of the IO controller 5.

If the address of the access destination is judged not to be an address of a memory 4, the converting units 22 and 52 does not convert the address and the processors 2 and 5 access the address of the access destination.

On the other hand, if the address of the access destination is judged to be an address of a memory 4, the converting units 22 and 52 recognize one or more controllers 3 for which a "used" "1" is set with reference to information stored in the storing units 23 and 53, that is, the contents of the table T1. In the table T1 of the first embodiment, the flag "1" is set for the controllers 3-1 and 3-2 (see No. 3 in FIG. 12).

Even when the address of the access destination is the address of any of the memories 4-1 through 4-4, the converting units 22 and 52 convert the address such that the processors 2 and 5 access the memories 4-1 or 4-2 through the controllers 3-1 or 3-2, respectively.

In other words, the converting units 22 and 52 judge whether an address indicating access destination to be accessed from the processors 2 and 5 is the address of a memory 4, and, if the address is an address of the memory 4, convert the address indicating the access destination of the processors 2 and 5.

Specifically as illustrated in FIG. 3, the controllers 3-1 and 3-2 for which the "used" flag is set are selected when the assigning address bits of the address of the access destination, that is, the values of the address bits 7:6, are "00" and "01", respectively. In other words, one of the controllers 3-1 and 3-2 are selected when the value of address bit 7 of an address of the access destination is "0".

For the above, the converting units 22 and 52 fix the value of address bit 7 of an address of the access destination to "0" so that the controllers 3-1 and 3-2 are selected and discard the value of address bit 39 of the address of the access destination. Furthermore, the converting units 22 and 52 shift the values of address bits 38:7 upstream, i.e., toward the higher bits by one bit.

Namely, the converting units 22 and 52 fix at least one of the values of the assigning address bits indicating an address of an access destination that the processors 2 and 5 are to access to a value of an indicating address bit specifying one or more controllers 3 assigned by the information that the storing units 23 and 53 store. In addition, the converting units 22 and 52 discard bits corresponds to a number of bits which is reduced from the most significant bits (MSB) of the address bits indicating a storing region of the memory 4 by fixing the assigning address bits. The converting units 22 and 52 shift bits in the bits assigning an access destination that the processors 2 and 5 are to access between the address bit corresponding to a fixed pattern in the assigning address bits and a bit lower by the number of discarded bits than the MSB of the address bits representing the storing region of a memory 4 by bits as many as the discarded bits.

Here, a fixed pattern represents a position of a bit to be fixed in the assigning address bits, or a pattern for fixing a bit of the assigning address bits, for example, No. 5-1, 5-2, 6-1, and 6-2 of FIG. 12 as to be detailed below.

Accordingly, in this case, the converting units 22 and 52 convert the values of the address bits 38:7 of the address indicating an access destination into values of address bits 39:8 of the address after the converting.

Thereby, even when a CPU 2 and the IO controller 5 serving as the processors access the address of any of the memories 4, the memory 4-1 connected to the controller 3-1 or the memory 4-2 connected to the controller 3-2 is always selected.

At that time, address bits 6:0 in the address of an access destination are not converted as the address bits indicate a continuous region in the memories 4-1 and 4-2 respectively connected to the controllers 3-1 and 3-2. Consequently, the converting units 22 and 52 output value of the address bits 6:0 before the conversion.

Namely, the values of the address bits 6:0 after the converting units 22 and 52 convert the address come to be the value of the address bits 6:0 of an address indicating an access destination that processors 2 and 5 are to access.

The address bits 42:40 of the address of an access destination is used to recognize whether the access is to be made to a memory 4 or to the IO controller 5 and to extend the memories if the system to be verified is large in scale. Accordingly, since the address bits 42:40 of address are not converted through the address conversion by the converting units 22 and 52, the converting units 22 and 52 output the value of the address bits 42:40 the same as those before the address conversion. In other words, the values of the address bits 42:40 in the address converted by the converting units 22 and 52 are the same as the values of the address bits 42:40 of an address indicating an access destination that the processors 2 and 5 are to access.

Furthermore, the value of the address bit "39" of the address of an access destination is not converted by the converting units 22 and 52, and is discarded.

Since the converting units 22 and 52 convert the address of an access destination such that the value of the address bits 7 of the address is fixed to "0" which selects the controller 3-1 or 3-2, the number of address bits representing the address of a memory 4 decreases. In other words, although a number of address bits indicating an address of the memory 40 is 40 bits, that is address bits 39:0, 39 bits of the address bits 39:8 and 6:0 are used to indicate the address of the memory 4 after the address conversion by the converting units 22 and 52.

As the above, the address conversion by the converting units 22 and 52 reduces by half of the storing region of a memory 4 which region serves as an access destination of the processors 2 and 5.

Accordingly, the number of address bits indicating an address of a memory 4 is reduced by the same number of address bits fixed by the address conversion of the converting units 22 and 52, that is, the same number of address bits of the storing region in the memory 4 reduced by fixing assigning address bits. In the first embodiment, the address bits indicating the address of a memory 4 are reduced by one bit.

For the above, the converting units 22 and 52 discard a number of address bits corresponds to a storing region of the memory reduced by fixing an assigning address bit through the address conversion from the MSB. In this case, since fixing an assigning address bit reduces the storing region of a memory 4 to one-half, the converting units 22 and 52 discards one address bit. Specifically, the converting units 22 and 52 discard the value of the address bit 39.

Figure 5:
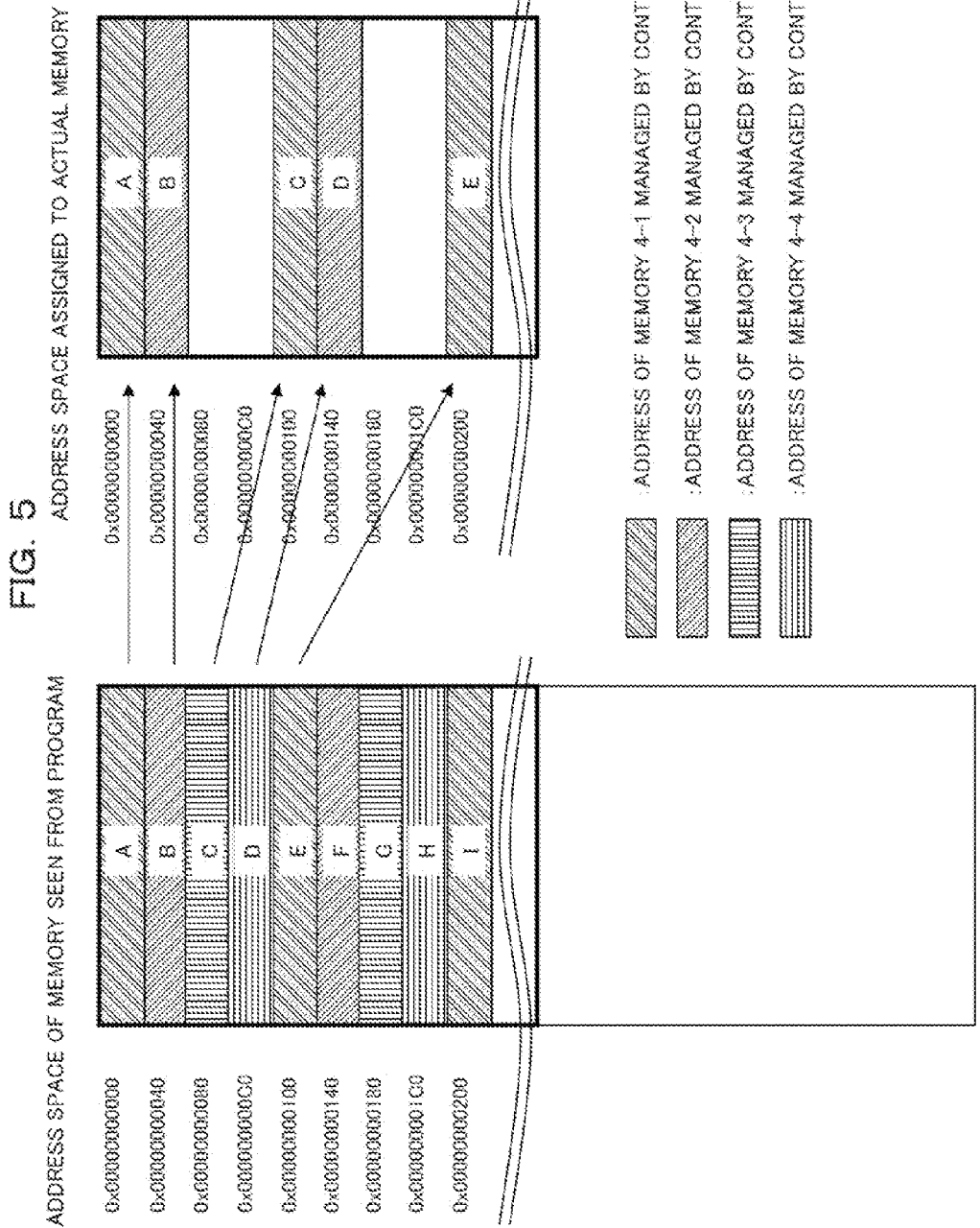
FIG. 5 is a diagram illustrating an address space of a memory after address conversion by a converting unit when a storing unit stores the information of FIG. 2.

FIG. 5 illustrates the association of an address space of a memory 4 seen from a test program to be executed in the logic verifying apparatus 1 and an address space of the memory 4 after being subjected to address conversion by the converting units 22 and 52 when the storing units 23 and 53 store information of FIG. 2.

The left side of FIG. 5 illustrates an address space of a memory 4 seen from a test program of the logic verification to be executed by the logic verifying apparatus 1. In the address space of a memory 4 seen from the test program, assigning address bits of an address of a memory 4, that is the values of the address bits 7:6, alternately indicate the memories 4 connected to the respective controllers 3 in units of 64 bytes.

At that time, the test program recognizes the address space of the memory (memories) 4 as a continuous region.

In the meantime, the right side of FIG. 5 illustrates an address space of a memory 4 converted through the address conversion by the converting units 22 and 52 and actually used in the logic verifying apparatus 1. As illustrated in FIG. 5, even when the test program accesses an address of any memory 4, the above address conversion converts the addresses of the access destinations into regions of the memories 4-1 and 4-2 managed by the controllers 3-1 and 3-2, respectively. In other words, even when the test program accesses an address of any memory 4, the addresses of the access destination are not converted into regions managed by the memories 4-3 and 4-4 managed by the controllers 3-3 and 3-4, respectively.

The address conversion illustrated in FIGS. 4 and 5 is just an example, and address bits to be converted may be varied in accordance with a system to be verified and/or the logic verifying apparatus 1. For example, the converting units 22 and 52 can carry out the following processing on the combination of controllers 3 different from the above.

Hereinafter, the converting units 22 and 52 carry out the same processing as that performed on the combination of the controllers 3 as illustrated in the table T1 of FIG. 2 unless specifically explained.

(i) when a "used" flag "1" is set for the controllers 3-3 and 3-4 and a not-used flag "0" is set for the controllers 3-1 and 3-2 (see No. 4 of FIG. 12):

In this case, as illustrated in FIG. 3, the controllers 3-3 and 3-4 for which the used flag is set are selected when the assigning address bits of the address of an access destination, that is the values of the address bits 7:6, are "10" and "11", respectively. In other words, when the value of the address bits 7 of the address of an access destination is "1", one of the controllers 3-3 and 3-4 is selected.

Then, the converting units 22 and 52 fix the address bits 7 of the address of an access destination to "1", which selects the controller 3-3 or 3-4.

(ii) when a "used" flag "1" is set for the controllers 3-1 and 3-3 and a not-used flag "0" is set for the controllers 3-2 and 3-4 (see No. 1 of FIG. 12):

In this case, as illustrated in FIG. 3, the controllers 3-1 and 3-3 for which the used flag is set are selected when the assigning address bits of the address of an access destination, that is the values of the address bits 7:6 are "00" and "10", respectively. In other words, when the value of the address bits 6 of the address of an access destination is "0", one of the controllers 3-1 and 3-3 is selected.

Here, the converting units 22 and 52 fix the address bit 6 of the address of an access destination to "0", which selects the controller 3-1 or 3-3, and shifts the values of the address bits 38:6 upwardly, i.e., towards the higher bits, by one bit.

At that time, since the address bits 5:0 of the address of an access destination are a continuous region in the memories 4-1 and 4-3 respectively connected to the controllers 3-1 and 3-3, the address bits 5:0 are not converted and the values before the address conversion is output.

(iii) when a "used" flag "1" is set for the controllers 3-2 and 3-4 and a not-used flag "0" is set for the controllers 3-1 and 3-3 (see No. 2 of FIG. 12):

In this case, as illustrated in FIG. 3, the controllers 3-2 and 3-4 for which the used flag is set are selected when the assigning address bits of the address of an access destination, that is the values of the address bits 7:6 are "01" and "11", respectively. In other words, when the value of the address bits 6 of the address of an access destination is "1", one of the controllers 3-2 and 3-4 is selected.

Here, the converting units 22 and 52 fix the address bit 6 of the address of an access destination to "1", which selects the controller 3-2 or 3-4, and shifts the values of the address bits 38:6 upwardly, i.e., towards the higher bits, by one bits.

At that time, since the address bits 5:0 of the address of an access destination are a continuous region in the memories 4-2 and 4-4 respectively connected to the controller 3-2 and 3-4, the address bits 5:0 are not converted and the values before the address conversion is output.

(iv) when a "used" flag "1" is set for the controllers 3-1 and 3-4 and a "not-used" flag "0" is set for the controllers 3-2 and 3-3 (see No. 5-1 and No. 5-2 of FIG. 12):

In this case, as illustrated in FIG. 3, the controllers 3-1 and 3-4 for which the used flag is set are selected when the assigning address bits of the address of an access destination, that is the values of the address bits 7:6 are "00" and "11", respectively.

Therefore, even if fixing any bit of the assigning address bits, the converting units 22 and 52 cannot convert the address to one that selects one of the controllers 3-1 and 3-4.

Likewise this combination, some cases do not undergo logic verification even if an assigning address bit of the address of a memory 4 is fixed.

In such cases, the converting units 22 and 52 change the value of address bits to be fixed through the use of one of the assigning address bits of an address indicating an access destination, i.e., the address bits 7:6, that the processors 2 and 5 are to access.

For example, when the value of the address bit 6 of the address indicating the access destination that the processors 2 and 5 are to access is "0", the converting units 22 and 52 fix the value of the address bits 7:6 of the address of the address destination to "00" (see No. 5-1 in FIG. 12) in the address conversion. On the other hand, when the value of the address bit 6 of the address indicating the access destination that the processors 2 and 5 are to access is "1", the converting units 22 and 52 fix the value of the address bits 7:6 of the address of the address destination to "11" (see No. 5-2 in FIG. 12).

The converting units 22 and 52 upwardly, i.e., towards the higher bits, shifts the values of the address bits 38:6 by one bit.

As the above, in the case (iv), the values of address bits 38:7 of the address of an access destination are converted to the values of address bits 39:8 of the address after the conversion by the converting units 22 and 52.

Thereby, when a CPU 2 and the IO controller 5 serving as processors access the address of any memory 4, one of the memories 4-1 and 4-4 respectively coupled to the controllers 3-1 and 3-4 is always selected.

At that time, since the address bits 5:0 of the address of an access destination are a continuous region in the memories 4-1 and 4-4 respectively connected to the controllers 3-1 and 3-4, the address bits 5:0 are not converted and the address bits 5:0 the same as that before the address conversion is output. In other words, the address bits 5:0 of the address of an access destination after the conversion by the converting units 22 and 52 comes to be the same as the address bits 5:0 of an address indicating an access destination that the processors 2 and 5 are to access.

Furthermore, the value of the address bit 39 of the address of an access destination is not converted by the converting units 22 and 52 and is discarded.

Although the address of a memory 4 is indicated by 40 bits at the address bits 39:0, the address conversion by the converting units 22 and 52 uses 38 bits at address bits 39:8 and 5:0 as the address of a memory 4.

However, the address bits 7:6 fixed through the address conversion by the converting units 22 and 52 have two combinations "00" and "11", which are one half in number of all the combinations of "00", "01", "10", and "11".

Accordingly, the address conversion by the converting units 22 and 52 reduces the number of address bits indicating the address of a memory 4 by the number of address bits of a storing region of the memory 4 reduced by fixing the assigning address bits, regardless of the number of address bits fixed. In this example, the number of address bits indicating the address of a memory 4 is reduced by one bit.

Consequently, the converting units 22 and 52 discard a number of address bits corresponding to the storing region of the memories 4 reduced by fixing assigning address bits through the address conversion from the MSB. In this case, since fixing the assigning address bits reduces the storing region of the memories 4 to one-half, the converting units 22 and 52 discard one address bit, i.e., discard the address bit 39.

(v) when a "used" flag "1" is set for the controllers 3-2 and 3-3 and a not-used flag "0" is set for the controllers 3-1 and 3-4 (see No. 6-1 and No. 6-2 of FIG. 12):

Hereinafter, the same processing as the case (iv) is performed unless otherwise specified.

In this case, as illustrated in FIG. 3, the controllers 3-2 and 3-3 for which the used flag is set are selected when the assigning address bits of the address of an access destination, that is, the values of the address bits 7:6, are "01" and "10", respectively.

Therefore, even if fixing any bit of the assigning address bits, the converting units 22 and 52 cannot convert the address such that one of the controllers 3-2 and 3-3 is selected.

In this case, the converting units 22 and 52 change the value of an address bits to be fixed through the use of one of the address bits 7:6, i.e., assigning address bits of an address indicating an access destination that the processors 2 and 5 are to access, i.e., the address bits 7:6, similarly to the above case (iv).

For example, when the value of the address bit 6 of the address indicating the access destination of the processors 2 and 5 is "0", the converting units 22 and 52 fix the value of the address bits 7:6 of the address of an address destination to "01" (see No. 6-1 in FIG. 12) when the address is to be converted. On the other hand, when the value of the address bit 6 of the address indicating the access destination that the processors 2 and 5 are to access is "1", the converting units 22 and 52 fix the value of the address bits 7:6 of the address of an address destination to "10" (see No. 6-2 in FIG. 12).

In the above cases (iv) and (v), the address bit 6, which is used for changing the address bit to be fixed, may be replaced by the address bit 7.

In selecting the controllers 3-1 and 3-4, the values of assigning address bits are fixed to "00" or "11" in accordance with the value of the address bit 7 (see No. 5-1 and No. 5-2 in FIG. 12). In contrast, in selecting the controllers 3-2 and 3-3, the values of assigning address bits are fixed to "01" or "10" in accordance with the value of the address bit (see No. 6-1 and No. 6-2 in FIG. 12).

Here, assuming that the address bit 7 is used for changing the value of the address bit to be fixed, the converting units 22 and 52 upwardly, i.e., towards the higher bits, shift the values of the address bits 38:8 of the address of an access destination by one bit and concurrently upwardly, i.e., towards the higher bits, shifts the value of the address bit 6 by two bits.

As the above, when a bit used for changing the value of an address bit to be fixed is assumed to be the address bit 7, that is, the upper bit of the assigning address bits, the converting units 22 and 52 convert the values of the address bits 38:8 of the address of an access destination into the values of the address bits 39:9 of the address obtained by the address conversion. In addition, the value of the address bit 6 of the address of an access destination is converted into the address bit 8 of the address after the conversion.

The setting of the above table T1 is effective in logic verification on a verification model including two controllers, e.g., the controllers 3-1 and 3-2, and also in load verification performed by distributing accesses to one or more particular controllers serving as a verification pattern for logic verification.

For example, with the configuration of the logic verifying apparatus 1 of FIG. 1, when logic verification is to be carried out by distributing accesses to the boundary of the addresses of the memories 4-1 and 4-2 respectively connected to the controllers 3-1 and 3-2, it is sufficient that the information that the storing units 23 and 53 store is set to a table T1 of FIG. 2.

After that, when logic verification is to be carried out by distributing accesses to the boundary of the addresses of the memories 4-1 and 4-3 respectively connected to the controllers 3-1 and 3-3, it is sufficient that the setting changing units 24 and 54 change the table T1 that the storing units 23 and 53 store such that the flag "1" is set only for the controllers 3-1 and 3-3.

As the above, the logic verifying apparatus 1 can carry out logic verification on a number of verification patterns through the use of a single test program simply by changing the setting by the setting changing units 24 and 54 without modifying the configuration of the logic verifying apparatus 1 of FIG. 1.

The description is hitherto made in relation to processing performed by the converting units 22 and 52, assuming that the system to be verified includes four controllers to be verified and the logic verifying apparatus 1 includes two controllers. The converting units 22 and 52 can carry out the same address conversion on a logic verifying apparatus 1 even if the apparatus includes a single controller 3.

FIG. 6 is a diagram illustrating information that the storing units 23 and 53 store as one example of the first embodiment.

Hereinafter, description will now be made in relation to logic verification performed, for example, when the storing units 23 and 53 store the contents a table T1' (T1) illustrated in FIG. 6.

The table T1' is represented by a different reference number from the table T1 of FIG. 2, but has the same format as the table T1. Hereinafter, the table T1 includes the table T1' unless otherwise described.

As illustrated in FIG. 6, the controller 3-1 is set to "1" while the controllers 3-2 through 3-4 are set to "0", This means that CPU 2 and the IO controller 5 are allowed to access only to the memory 4-1, which is connected to the controller 3-1, but are not allowed to access to the memories 4-2 through 4-4, which are connected to the controllers 3-2 through 3-4, respectively.

The setting of the table T1' is effective in logical verification on a verification model including a single controller, such as the controller 3-1, and in load verification through concentrating accesses to a particular controller for one verification pattern of logical verification.

For example, in logical verification of concentrating accesses to the address boundary of the memory 4-1 connected to the controller 3-1 in the configuration of the logic verifying apparatus 1 of FIG. 1, the information that the storing units 23 and 53 store information is satisfactorily set to be the Table T1' of FIG. 6.

If logical verification of concentrating accesses to the address boundary of the memory 4-2 connected to the controller 3-2 is carried out after the logical verification of concentrating accesses to the address boundary of the memory 4-1 connected to the controller 3-1, the setting changing units 24 and 54 satisfactorily change the contents of the table T1' that the storing units 23 and 53 stores such that only the controller 3-2 is set to "1".

As the above, the logic verifying apparatus 1 can perform logical verification on a number of verification patterns through the use of a single test program, keeping the configuration of the logic verifying apparatus 1 of FIG. 1, simply by changing the setting by the setting changing units 24 and 54.

Figure 7:
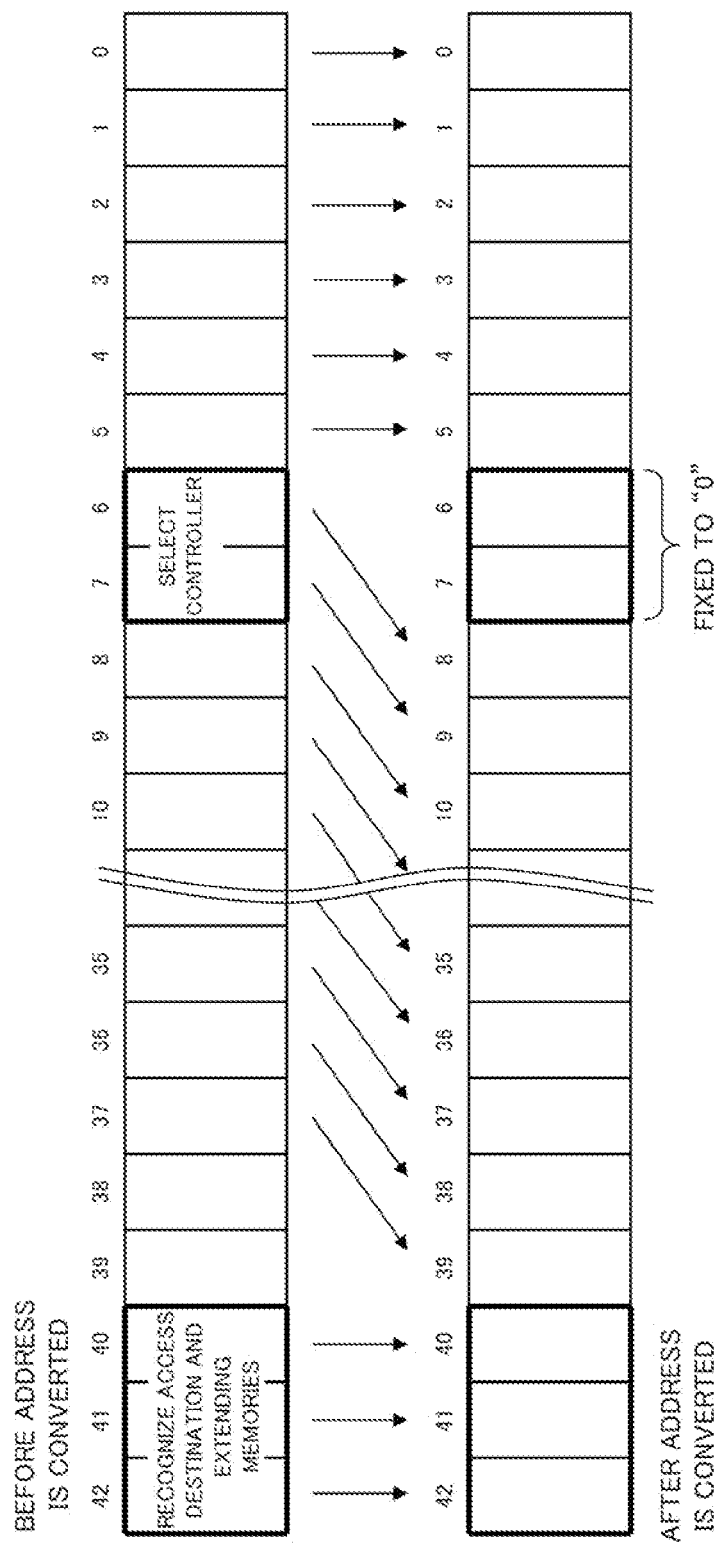
FIG. 7 is a diagram illustrating a method of converting an address by a converting unit when a storing unit stores the information of FIG. 6.

FIG. 7 is a diagram illustrating address conversion by the converting units 22 and 52 if the storing units 23 and 53 store the information of FIG. 6.

Hereinafter, description will now be made in relation to address conversion by the converting units 22 and 52 when the storing units 23 and 53 store the information of FIG. 6.

Hereinafter, the converting units 22 and 52 carry out the same processing performed on the combinations of controllers 3 in the Table T1 as that described with reference to FIG. 2 unless otherwise described.

In the table T1' in the first embodiment, a used flag "1" is set for the controller 3-1. As illustrated in FIG. 3, the controller 3-1 for which a "used" flag is set is selected when assigning address bits indicating the address of an access destination, i.e., the value of the address bits 7:6, are "00".

In this case, the converting unit 22 and 52 upwardly shift the value of the address bits 37:6 of the address of an access destination by two bit and fix the values of the address bits 7:6 to "00", which selects the controller 3-1.

Accordingly, when the both values of the address bits 7:6 are fixed, the value of the address bits 37:6 of the address of an access destination is converted to the values of address bits 39:8 of an address obtained through the conversion by the converting units 22 and 52.

Thereby, when a CPU 2 and the IO controller 5 serving as processors access the address of any memory 4, the memory 4-1 connected to the controller 3-1 is always selected.

At that time, since the address bits 5:0 of the address of an access destination are a continuous region in the memory 4-1 connected to the controller 3-1, the address bits 5:0 are not converted and the values before the conversion are output as they are. In other words, the address bits 5:0 of the address of an access destination after the conversion by the converting units 22 and 52 comes to be the same as the address bits 5:0 of an address indicating an access destination that the processors 2 and 5 are to access.

Furthermore, the values of the address bits 39:38 of the address of an access destination are not converted by the converting units 22 and 52 and are discarded.

Although the address of a memory 4 is assigned by 40 bits at the address bits 39:0, the address conversion by the converting units 22 and 52 uses 38 bits at address bits 39:8 and 5:0 as the address of a memory 4.

The address bits 7:6 fixed through the address conversion by the converting units 22 and 52 have a single combination "00", which is the one-quarter in number of all the combinations of "00", "01", "10", and "11".

In other words, address conversion by the converting units 22 and 52 uses one-quarter of the storing region of the memories 4 as the access destination.

Accordingly, the number of address bits indicating an address of a memory 4 is reduced by the number of address bits to be fixed by the address conversion of the converting units 22 and 52, that is by the number of address bits corresponding to storing regions of one or more memories 4 reduced due to the fixing one or more assigning address bits. In this example, the number of address bits indicating the address of a memory 4 is reduced by two bits.

For the above, the converting units 22 and 52 discard a number of address bits corresponds to storing region reduced by fixing assigning address bits through the address conversion from the MSB. In this case, since fixing an assigning address bits reduces the storing region in a memory to one-quarter, the converting units 22 and 52 discard two address bits, specifically, the address bits 39:38.

Figure 8:
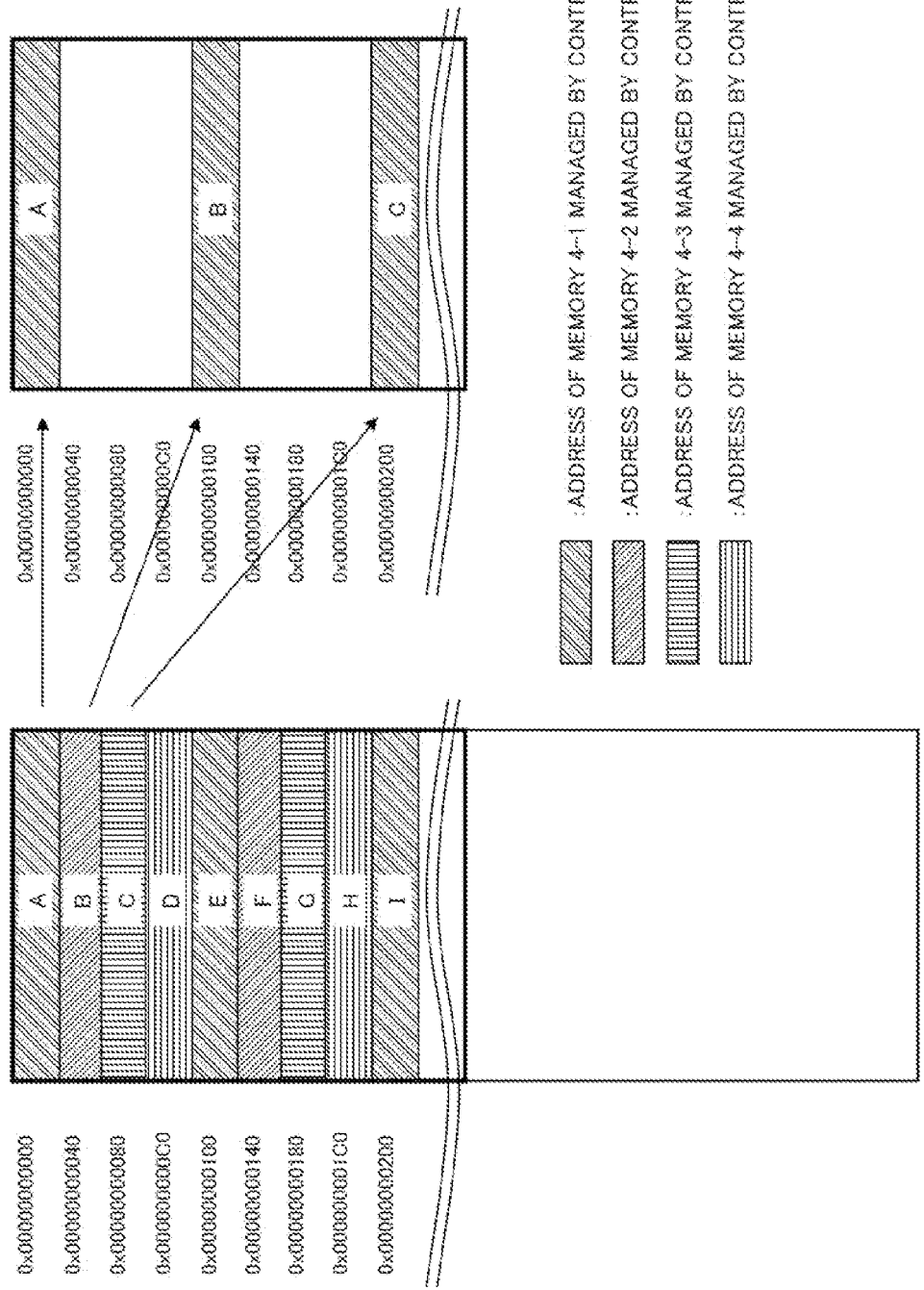
FIG. 8 is a diagram illustrating an address space of a memory after address conversion by a converting unit when a storing unit stores the information of FIG. 6.

FIG. 8 illustrates the association of an address space of a memory 4 seen from a test program to be executed in the logic verifying apparatus 1 and an address space of the memory 4 after being subjected to address conversion by the converting units 22 and 52 when the storing units 23 and 53 stores the information of FIG. 6.

The left side of FIG. 8 illustrates an address space of a memory 4 seen from a test program to be executed in the logic verification. In the address space of a memory 4 seen from the test program, assigning address bits of an address of a memory 4, that is the values of the address bits 7:6 alternately indicate the memories 4 connected to the respective controllers 3 in units of 64 bytes.

At that time, the test program recognizes the address space of the memory (memories) 4 as a continuous region.

In the meantime, the right side of FIG. 8 illustrates an address space of a memory 4 converted through the address conversion by the converting units 22 and 52 and actually used in the logic verifying apparatus 1. As illustrated in FIG. 8, even when the test program accesses an address of any memory 4, the above address conversion converts the addresses of the access destinations into region of the memory 4-1 managed by the controller 3-1. In other words, even when the test program accesses an address of any memory 4, the addresses of access destinations are not converted into regions of the memories 4-2 through 4-4 managed by the controllers 3-2 through 3-4.

As described above, in the first embodiment, the converting units 22 and 52 convert an address indicating an access destination that the processors 2 and 5 are to access by shifting address bits of the address of the access destination of the processors 2 and 5 on the basis of the information that the storing units 23 and 53 store and the assigning address bits.

Since the address indicating an access destination of the processors 2 and 5 is converted by the converting units 22 and 52, the selecting unit 25 of the CPU 2, serving as the processor, accesses the address obtained by the conversion. In the meantime, the IO controller 5 serving as the processor accesses the address obtained by the conversion through at least one of the controllers 3 assigned by the information that the storing unit 53 stores.

Then, the controller 3 carries out interleaving control on an access to the corresponding memory 4 that the processors 2 and 5 make on the basis of values of the assigning address bits in the address converted by the conversion units 22 and 52.

As described above, the address bits 42:40 of the address indicating an access destination of the processors 2 and 5 in the present invention may be used for extending the storing units included in the system to be verified if the system is large in scale.

Here, an example of the large-scale system to be verified includes eight controllers to be verified including two combinations of controllers to be verified each of which conducts interleaving control as described above.

In the above case of extending memories, the address bits 42:40 are used for discriminating the two combinations of controllers each of which combinations carries out interleaving control from each other.

If either one of the two combinations each carrying out interleaving control included in the logic verifying apparatus 1 has controllers 3 less in number than that of the controllers to be verified, the converting units 22 and 52 sufficiently covert only the address of the memories 4 belonging to the one combination, i.e., addresses to be converted.

For each of controllers to be verified included in the system to be verified, a "used" or "not-used" flag is set, and association of each controller with the set flag is stored in the form of information of the table T1 that the storing units 23 and 53 store. Furthermore, each of the sets carrying out interleaving control is also stored in the form of information of the table T1 that the storing units 23 and 53 store so that the two combinations of controllers are discriminated from each other.

Accordingly, when an address indicating an access destination of the processors 2 and 5 is an address of the memory 4 during the process of the above address conversion, the converting units 22 and 52 judge whether the address is one to be converted by referring to the information that the storing units 23 and 53 store. If the converting units 22 and 52 judge the address to be one converted, the converting units 22 and 52 can convert the address indicating the access destination of the processors 2 and 5.

In other words, when the converting units 22 and 52 judges whether the address indicating an access destination of the processors 2 and 5 is an address of a memory 4, the converting units 22 and 52 concurrently recognize a combination of interleaving control that the address belongs on the basis of the value of a predetermined position in the address bits 42:40 of the address. Next, the converting units 22 and 52 refer to the table T1 of the discriminated combination of interleaving control which table is stored by the storing units 23 and 53, and judges the presence or the absence of a controller for which a "not-used" flag is set in the table T1.

If the converting units 22 and 52 judge the presence of a controller 3 for which a not-used flag is set in the table T1, the converting units 22 and 52 judge that the combination of interleaving control that the address belongs is to be converted and therefore converts the address indicating an access destination of the processors 2 and 5.

As the above, in the combination of interleaving control that the address of the memory 4, that is, the access destination, belongs if controllers 3 are less in number than that of the controllers to be verified, the converting units 22 and 52 judges the address is one to be converted and convert the address.

(A-3) Operation of a Processor in the First Embodiment:

Next, description will now be made in relation to operation performed by the CPUs 2 and the IO controller 5 serving as the processors.

Figure 9:
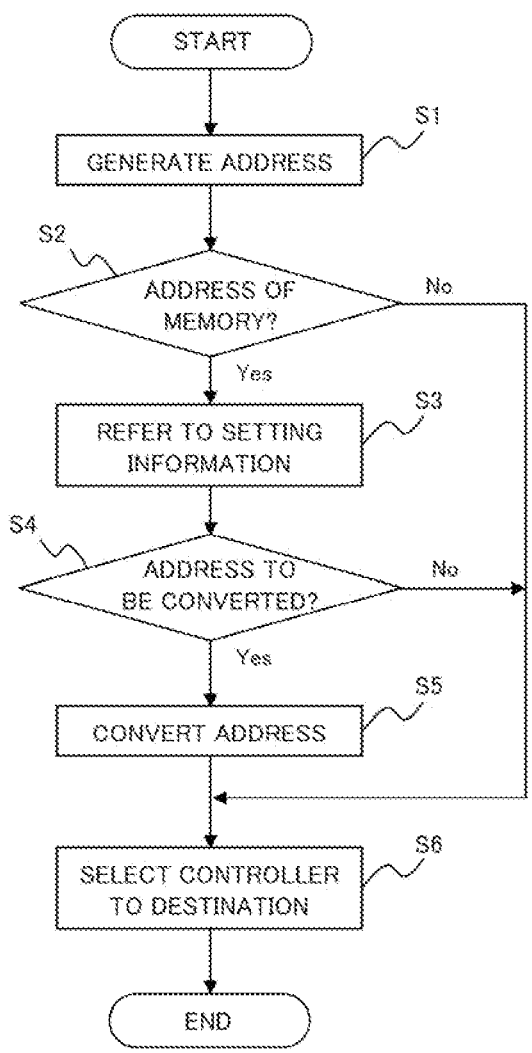
FIG. 9 is a flow diagram illustrating a succession of procedural steps of address processing performed in a CPU serving as an example of a processor of the first embodiment.

FIG. 9 is a flow diagram illustrating a succession of procedural steps of address processing performed by a CPU 2 serving as a processor.

First of all, the calculating unit 21 of the CPU 2 generates an address indicating an access destination (step S1).

Next, the converting unit 22 judges whether the address which is generated by the calculating unit 21 and which indicates the access destination is an address of a memory 4 (step S2). At that time, the converting unit 22 judges whether the access destination is a memory 4 by referring to the address bits 42:40 of an address of the address destination.

If the address indicating the access destination is not an address of a memory 4 (No route of step S2), the address is not converted and therefore the selecting unit 25 selects a route through which the issued access is to be output. In other words, the selecting unit 25 selects a controller 3 connected to the access destination (step S6). Then, the CPU 2 outputs the access through the selected controller 3 to the access destination.

On the other hand, if the address indicating the access destination is an address of a memory 4 (Yes route of step S2), the converting unit 22 refers to the setting information for address conversion which information is stored in the storing unit 23, that is the table T1 (step S3).

Next, the converting unit 22 judges, on the basis of the table T1, whether the address indicating the access destination is an address to be converted (step S4).

If the address indicating the access destination is not an address to be converted (No route of step S4), the procedure proceeds to step S6.

On the other hand, if the address indicating the access destination is an address to be converted (Yes route of step S4), the converting unit 22 converts the address indicating the access destination (step S5) and the procedure proceeds to step S6.

Figure 10:
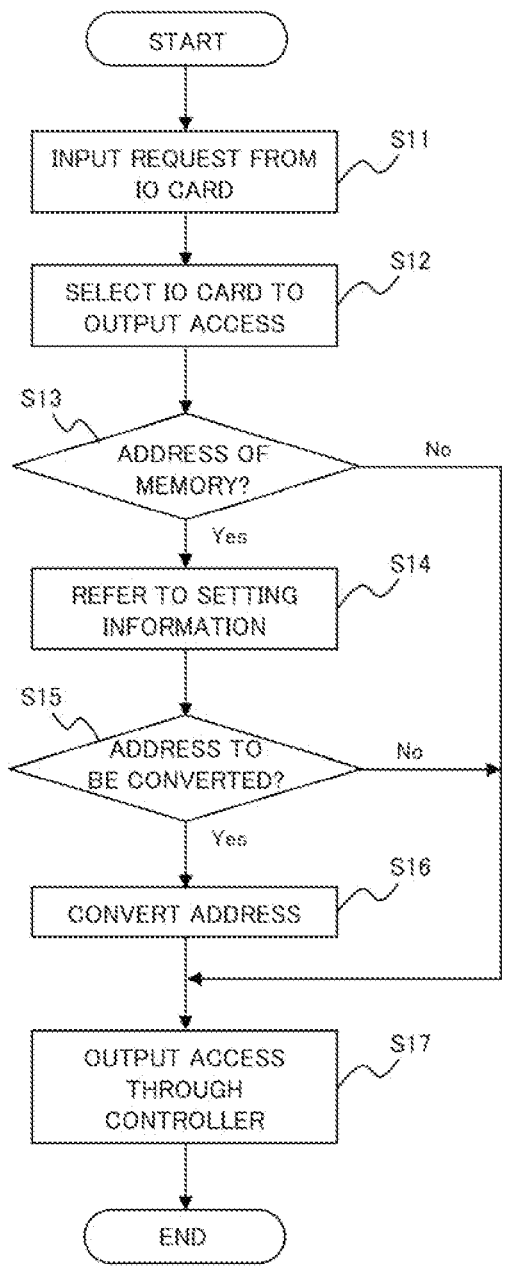
FIG. 10 is a flow diagram illustrating a succession of procedural steps of address processing performed in an IO controller serving as another example of a processor of the first embodiment.

FIG. 10 is a flow diagram illustrating a succession of procedural steps of address processing performed by the IO controller 5 serving as a processor.

For the beginning, an IO card 6 inputs an access request into the IO controller 5. Specifically, the IO card 6 generates an address that indicating an access destination and outputs the generated address to the IO controller 5 (step S11).

Next, the arbitration unit 51 of the IO controller 5 arbitrates the access of the IO card 6 on the basis of the address indicating the access destination input from the IO card 6. Specifically, the arbitration unit 51 selects an access to be output to the converting unit 52 from accesses from the IO cards 6-1 and 6-2 (step S12).

After that, the converting unit 52 judges whether an address indicating an access destination which address is generated by the IO card 6 is an address of a memory 4 (step S13). At that time, the converting unit 52 refers to the address bits 42:40 of the address indicating the access destination to judge whether the access destination is a memory 4.

If the address indicating the access destination is not an address of the memory 4 (No route of step S13), the address is not converted. Accordingly, the IO controller 5 accesses the address destination indicated by the address through one of the controllers 3 that is assigned by the information that the storing unit 53 stores (step S17).

On the other hand, if the address indicating the access destination is an address of the memory 4 (Yes route of step S13), the converting unit 52 refers to the setting information for address conversion which information is stored in the storing unit 53, that is the table T1 (step S14).

Next, on the basis of the table T1, the converting unit 52 judges whether the address indicating the access destination is an address to be converted (step S15).

If the address indicating the access destination is not one to be converted (No route in step S15), the procedure proceeds to step S17.

On the other hand, if the address indicating the access destination is one to be converted (Yes route in step S15), the converting unit 52 converts the address indicating the access destination (step S16) and the procedure proceeds to step S17.

Figure 11:
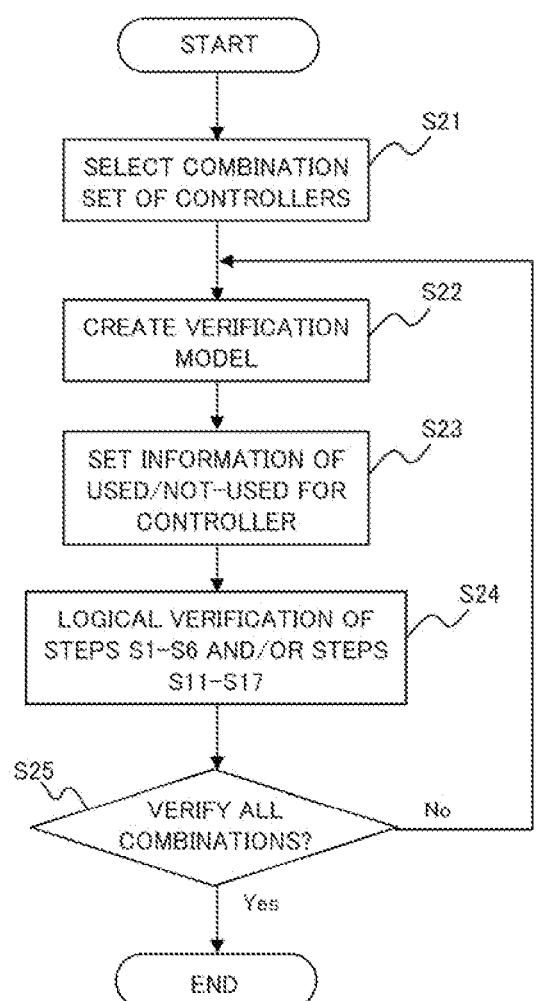
FIG. 11 is a flow diagram illustrating a succession of procedural steps of logic verification through address conversion by a converting unit.
Figure 13:
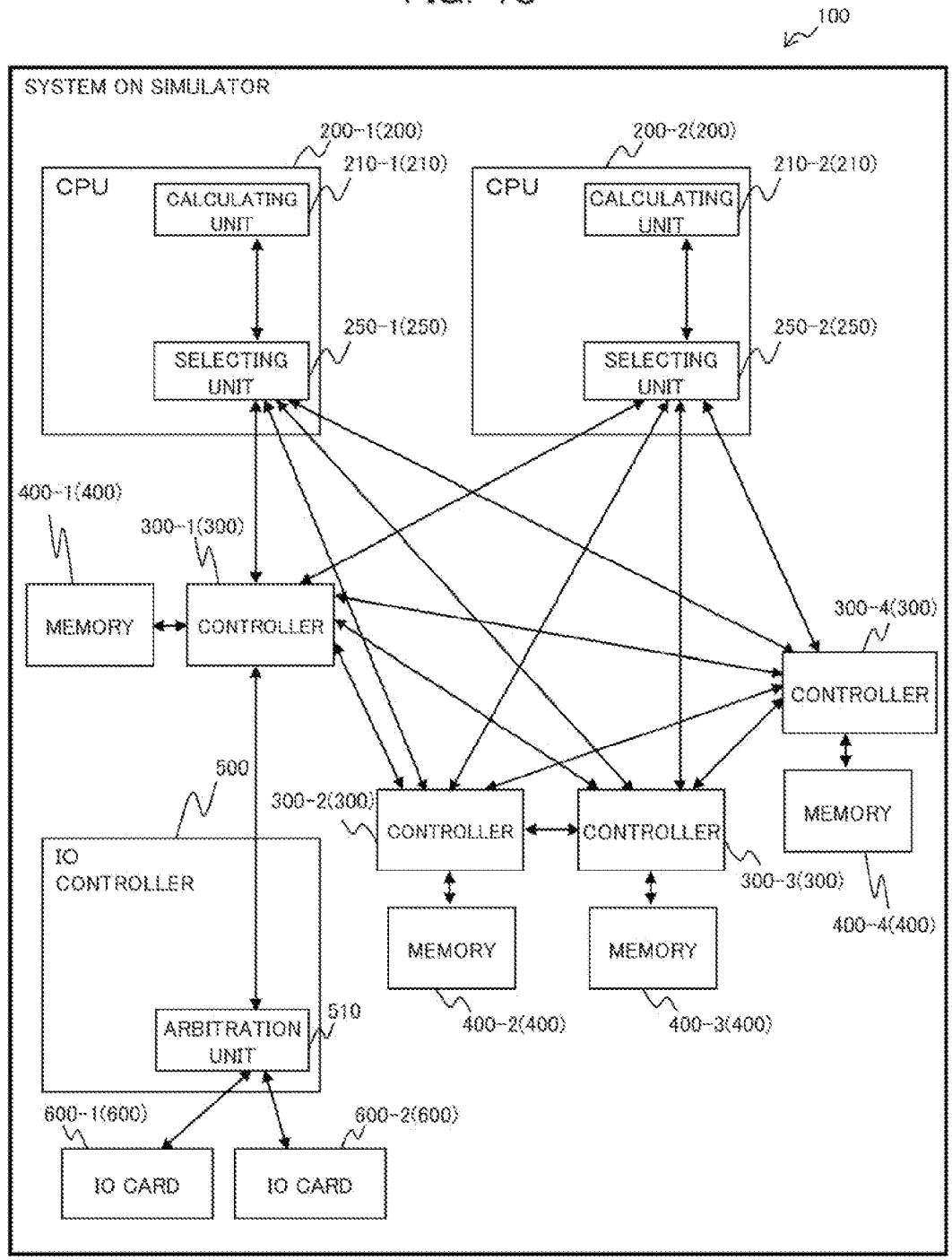
FIG. 13 is a block diagram illustrating an example of the configuration of a logic verifying apparatus.
Figure 14:
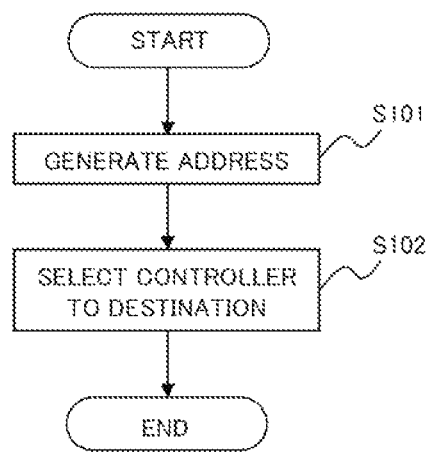
FIG. 14 is a flow diagram illustrating address processing in a normal CPU.
Figure 15:
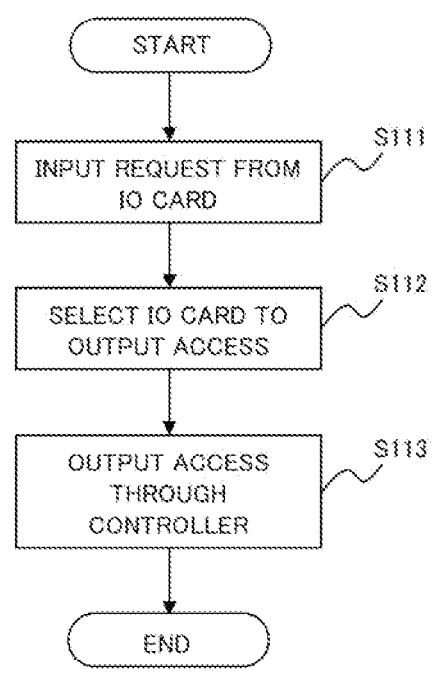
FIG. 15 is a flow diagram illustrating address processing in a normal IO controller.

(A-4) Procedure of Logic Verification Using the Address Conversion of the First Embodiment:

FIG. 11 is a flow diagram illustrating an example of a succession of procedural steps of logic verification through address conversion by the converting units 22 and 52 of the first embodiment.

Hereinafter, description will now be made in relation to a procedure of logic verification performed on a system to be verified by the address conversion of the above converting units 22 and 52 in the verification model of the logic verifying apparatus 1.

First of all, a user or the like that conducts the logic verification refers to the number of controllers to be verified accommodated in the system to be verified and the number of controllers 3 can be accommodated in the verification model among the controllers to be verified. On the basis of the result of the referring, the user or the like selects combinations of the controllers so that verification patterns that are overlooked is less when the logic verification is carried out (step S21). For example, the user or the like selects the combinations of controllers 3 as illustrated in FIG. 12.

Here, the user or the like means a user that is to conduct logic verification or, if the logic verification is carried out by means of software, the program that is to conduct the logic verification.

Next, the user or the like selects one combination that has not undergone the logic verification among the selected combinations of the controllers 3, and creates a verification model (step S22).

After that, the user or the like sets information stored in the storing units 23 and 53 respectively included in the processors 2 and 5 of the logic verifying apparatus 1 (step S23) in accordance with the selected combination of the controllers 3.

Then, through the use of the created verification model the test program and a test benchmark for logic verification are executed, so that the logic verification is carried out (step S24) through the above procedure of steps S1 through S6 described above with reference FIG. 9 and/or steps S11 through S17 described above with reference to FIG. 10.

Upon completion of the logic verification using the verification model, the user or the like checks the presence or not presence of a combination of the controllers 3 which has not undergone the logic verification and for which a verification model can be created among the combinations selected in step S21 (step S25).

If the judgment concludes the presence of a combination which has not undergone the logic verification and for which a verification model can be created (No route of step S25), the users or the like carry out procedure of step S22 and the subsequent steps using the combination which has not undergone the logic verification.

If the judgment concludes that there is not a combination which has not undergone the logic verification or which is not capable of creating a verification model of the combination which has not undergone the verification (Yes route of step S25), the logic verification is terminated.

As described above, the user or the like carries out logic verification of the system to be verified through the use of verification models.

Next, description will now be made in relation to selection of combinations of controllers 3 for logic verification through address conversion with reference to FIG. 12.

FIG. 12 is a diagram illustrating combinations of controllers 3 for logic verification through address conversion as one example of the first embodiment.

As described above, if one or more controllers 3 corresponding to controllers to be verified which controllers conduct interleaving control are not accommodated in a verification model of the logic verifying apparatus 1, the logic verifying apparatus 1 can accomplish the logic verification by performing the address conversion detailed above. In other words, processing by the processors 2 and 5 allows the user or the like to create verification models, which have been conventionally difficult to create due to the restriction in the capacity of a simulator, and to accomplish the logic verification.

Specifically, the user or the like changes the value of an address bit to be fixed in the assigning address bits or changes the position of the address bits to be fixed in the assigning address bits of a memory 4 in above step S21. Thereby, the user or the like creates a number of verification models different in information in each controller 3 to be incorporated and not to be incorporated.

For example, the user or the like creates verification models corresponding one to each of the cases where the logic verifying apparatus 1 includes the controllers 3-1 through 3-4 in the combinations No. 1 through No. 6-2 and where the logic verifying apparatus 1 includes each individual of the controllers 3-1 through 3-4.

At that time, the user or the like creates a number of verification models such that each of the controllers to be verified included in the configuration of the system to be verified is incorporated in at least one of the combination, that is, at least one of created verification models. Otherwise, the users or the like creates the verification models such that all the connection routes between the controllers to be verified and the CPU serving as a processor to be verified and between two controllers to be verified are reproduced in one or more combinations, i.e., in one or more of the verification models.

Consequently, the logic verifying apparatus 1 can accomplish logical verification close to logical verification performed on a verification model accommodating all the controllers corresponding to the controllers to be verified which are included in the system to be verified and which carry out interleaving control, so that it is possible to reduce verification patterns that are overlooked in logic verification.

As described above, the logic verifying apparatus 1 of the first embodiment carries out logic verification on a system including a processor to be verified and a number of controllers to be verified each of which controls access of the processor to a memory through the use of verification models.

The logic verifying apparatus 1 includes the processors 2 and 5 serving as the processors to be verified and controllers 3 which correspond to the number of controllers to be verified, the number of which is less than that of the controllers to be verified, controls access of the processors 2 and 5 to the memories 4, in verification models.

In addition the processors 2 and 5 include the storing units 23 and 53, respectively, which store information which assigns the controllers 3 to be used in a verification model from the controllers 3, the number of which is less than that of the controllers to be verified.

Furthermore, the processors 2 and 5 include the converting units 22 and 52, respectively, which convert an address indicating an access destination of the processors 2 and 5 such that the processors 2 and 5 access to a memory 4 through the controller 3 assigned by the information that the storing units 23 and 53 store.

Specifically, the converting units 22 and 52 convert an address of a memory included in the system to be verified into an address of a memory 4 of the logic verifying apparatus 1 such that the processors 2 and 5 can access to the memory 4 through a controller 3 assigned by the information that the storing units 23 and 53 store.

Namely, the converting units 22 and 52 convert an address of an access destination on the basis of the information that the storing units 23 and 53 store and thereby selects only a particular controller 3. In detail, since an unselected controller is used for an access to the memory 4 connected to the unselected controller 3, the unselected controller 3 and the memory 4 connected thereto can be excluded from verification models to be carry out logic verification.

Accordingly, even if the verification models used by the logic verifying apparatus 1 does not include some of the memories 4 and the controllers 3, accesses to the memories 4 in the logic verifying apparatus 1 can be verified under the presence of the controllers 3 less in number. This largely reduces a logical capacity of each verification model and eliminates the requirement of a large-capacity logic verifying apparatus, reducing the cost for logic verification.

The converting units 22 and 52 convert an address of an access destination such that the processors 2 and 5 access the access destination through a controller assigned by the information that the storing units 23 and 53 store, it is possible to concentrate accesses to an address boundary of a particular memory 4 or to diffuse the accesses.

Furthermore, the converting units 22 and 52 convert the address indicating an access destination of the processors 2 and 5 by shifting bits of the same address on the basis of the information that the storing units 23 and 53 store and the assigning address bits to recognize the controller 3 in the address indicating an access destination.

Specifically, the converting units 22 and 52 fix at least one bit of the assigning address bits of the address indicating the access destination of the processors 2 and 5 to a value that recognize the controller 3 assigned by information stored the storing units 23 and 53. Concurrently, the converting units 22 and 52 discard a number of address bits indicating a storing region of a memory 4 which bits start from the MSB and are as many as bits reduced by fixing the assigning address bits. Then, the converting units 22 and 52 shift bits between the address bit at a position corresponding to the fixed pattern in the assigning address bits and a bit lower by the number of discarded bits than the MSB in the address bits indicating a storing region in a memory 4.

Thereby, the converting units 22 and 52 convert the address indicating the access destination of the processors 2 and 5.

As the above, the converting units 22 and 52 convert an address by shifting one or more assigning address bits of the address indicating the access destination, it is possible to mitigate load on the processors 2 and 5 included in the logic verifying apparatus 1 and the use of the storing regions of the memories 4 that are used in the address conversion.

The controller 3 interleaving controls accesses of the processors 2 and 5 to the memory 4 on the basis of the values of the assigning address bits of the address obtained by the conversion by the converting units 22 and 52.

Accordingly, the logic verification of the system that interleaving controls the memories 4 can eliminate the requirement of some of the controllers 3 and the memories 4 connected to the controllers 3, which are preferably the same in number as that of the controllers to be verified and the memories connected to the controllers to be verified.

In addition, the converting units 22 and 52 judge whether the address indicating an access destination of the processors 2 and 5 is an address of a memory 4, and if judging the address is an address of a memory 4, the address conversion is conducted.

This allows the logic verifying apparatus 1 to carry out logic verification on an address of an access destination except for the memories 4 without converting the address, so that the load on the converting units 22 and 52 therein used for address conversion can be suppressed.

Furthermore, if the converting units 22 and 52 judge the address to be an address of a memory 4, the converting units 22 and 52 judge whether the address indicating an access destination of the processors 2 and 5 is to be converted by referring to the information that the storing units 23 and 53 store. If the converting units 22 and 52 judge the address to be converted, the converting units 22 and 52 convert the address.

As the above, in logic verification on a system including a number of combinations of interleaving control, the logic verifying apparatus 1 can convert addresses of memories belonging to one or more particular combinations of interleaving control.

Consequently, the logic verifying apparatus 1 carries out logic verification on memories belonging to the remaining combinations of interleaving control without converting the addresses of the memories, which makes it possible to reduce the use of address conversion on the processors 2 and 5 in the logic verifying apparatus 1.

The information that the storing units 23 and 53 store includes association of a number of memories to be verified with the controllers 3, the number of which is less than that of the controllers to be verified.

In addition, the processors 2 and 5 include the setting changing units 24 and 54 that set and change the information that the storing units 23 and 53 store, respectively.

With this configuration, simple change the setting for address conversion of the converting units 22 and 52 by the setting changing units 24 and 54 makes a single test program executed in the logic verifying apparatus 1 to carry out logic verification of concentrating accesses to various addresses and diffusing accesses.

Advantageously, a single test program can attain the same effects as a case where many test programs are developed, which makes it possible to reduce or eliminate the steps of developing many test programs.

Examples of a processor are the CPU 2 and the IO controller 5.

The CPU 2 serving as a processor includes the calculating unit 21 that generates the address indicating an access destination, and the selecting unit 25 that selects one of the controllers 3 assigned by the information that the storing unit 23 stores and accesses an entity indicated by the address converted by the converting unit 22 through the selected controller 3.

Then, the converting unit 22 in the CPU 2 converts an address which indicates an access destination that the processor 2 is to access and which is generated by the calculating unit 21, and outputs the converted address to the selecting unit 25.

As the above, the converting unit 22 and storing unit 23 cooperating with the calculating unit 21 and the selecting unit 25 of the CPU 2 makes the CPU 2 to function as a processor.

The IO controller 5 serving as a processor includes an arbitration unit 51 that arbitrates an access which is issued from at least one external device connected to the processor 5 and which indicates the access destination of the external device on the basis of the address assigning the access destination of the external device.

Then, the converting unit 52 of the IO controller 5 converts the address which indicates the access destination of the external device and which is arbitrated by the arbitration unit 51.

In addition, the IO controller 5 serving as a processor accesses the address obtained by the conversion through one of the controllers 3 as signed by the information that the storing unit 53 stores.

As the above, the converting unit 52 and the storing unit 53 cooperating with the arbitration unit 51 of the IO controller 5 makes the IO controller 5 to function as a processor.

The IO controller 5 serving as a processor is connected to at least one external device connected to the IO controller 5 via an IO card 6 that controls connections between the IO controller 5 and an auxiliary storage and that between the controller 5 and the external device connected through a LAN.

The technique disclosed here can carry out logic verification on a computer system including a number of controllers each controlling access from a processor to a memory at a low cost.

In addition, the disclosed technique can easily concentrate accesses to address boundaries of various memories and diffuse accesses.

(B) Others

A preferred embodiment of the present invention is described as the above. However, the present invention should by no means be limited to the foregoing embodiment. Various changes and modifications can be suggested without departing from the gist of the present invention.

For example, the system to be verified includes four controllers to be verified while the logic verifying apparatus 1 includes two controllers 3. The configurations of the system and the logic verifying apparatus 1 are not limited to this and therefore can be arbitrarily selected in accordance with the scale of the system to be verified and the modification models.

An address indicating the access destination of the processors 2 and 5 may have a bit length and positions of assigning address bits different from those described above. Accordingly, the positions of assigning address bits can be determined in an address having an arbitrarily bit length in accordance with the configurations the system to be verified and the logic verifying apparatus 1.

The program (i.e., logic verifying program) to realize the function of the processors 2 and 5 is provided in the form of being stored in a computer-readable recording medium, such as a flexible disk, a CD (e.g., CD-ROM, CD-R, CD-RW), a DVD (e.g., DVD-ROM, DVD-RAM, DVD-R, DVD-RW, DVD+R, DVD+RW), a magnetic disk, an optical disk, or a magneto-optical disk. In this case, a computer reads the programs from the recording medium and sends the read programs to an internal or external memory to store for use. Alternatively, the program may be recorded in a memory device (a recording medium), such as a magnetic disk, an optical disk or a magneto-optical disk, and is provided to the computer from the memory device through a communication path.

In order to realize the functions of the processors 2 and 5, the program stored in an internal memory (i.e., one of the memories 4 of the logic verifying apparatus 1 in the first embodiment) is executed by the microprocessor (i.e., the CPU 2 of the logic verifying apparatus 1 of the first embodiment). At that time, the computer may read the program stored in a recording medium and execute the program.

Here, a computer is a concept of a combination of hardware and an OS and means hardware which operates under control of the OS. Otherwise, if an application program operates hardware independently of an OS, the hardware corresponds to the computer. Hardware includes at least a microprocessor such as a CPU and means to read a computer program recorded in a recording medium. In the first embodiment, the logic verifying apparatus 1 serves to function as a computer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment has been described in detail, it should be understood that the various changes, substitutions, and alterations could be made hereto without departing from the spirit and scope of the invention.

What is claimed is:

1. A logic verifying apparatus for carrying out logic verification on a system including a first processor and a plurality of first controllers that control a first access that the first processor makes to a memory, the access being made by the first processor using a verification model, the logic verifying apparatus comprising:

a second processor corresponding to the first processor; and one or more second controllers corresponding to the first controllers, the number of which is less than that of the first controllers, each controls a second access to the memory, the access being made by the second processor, the second processor and the second controllers serving as elements in the verification model, and the second processor including:

a storing unit that stores information for assigning one or more of the second controllers that is to be used as the verification model, wherein the second processor converts a first address indicating an entity that the second processor is to access through the one second controller assigned by the information stored in the storing unit, into a second address, such that the second processor access the memory, by converting one or more assigning address bits that assign the one second controller through which the second processor makes the access into a value indicating the one second controller assigned by the information stored in the storing unit, and the one second controller interleaving-controls the second access that the second processor makes to the memory, based on the values of one or more assigning address bits in the second address, wherein the second processor converts the address by:

fixing at least one of the assigning address bits of the first address, wherein the assigning address bits are not the most significant bit of the first address, to a value of an assigned address bits that specifies the one second controller assigned by the information stored in the storing units;

discarding the number of bits which is reduced from the most significant bit of an address bit representing a memory region of the memory by fixing the at least one of the assigning address bits; and shifting, by the number of the discarded bits, bits in the first address indicates the entity that the first processor accesses between an address bit corresponding to a fixed pattern in the assigning address bits and a bit lower by the number of the discarded bits than the most significant bit.

2. The logic verifying apparatus according to claim 1, wherein:

the second processor converts the address by shifting bits of the address to the second address based on the information stored in the storing units and one or more assigning address bits that assign the one second controller through which the second processor makes the access and that is included in the first address.

3. The logic verifying apparatus according to claim 1, wherein the second processor:

generates the first address of the entity that the second processor is to access;

converts the first address of the entity that the second processor is to access to the second address; and selects the one second controller from the one or more second controllers assigned by the information stored in the storing unit based on the second address and accesses the second address through the one second controller selected.

4. The logic verifying apparatus according to claim 3, wherein the second processor is a Central Processing Unit (CPU).

5. The logic verifying apparatus according to claim 1, wherein the second processor arbitrates an access that at least one external device connected to the second processor is to make, based on the first address which indicates an entity that the external device is to access and which is issued from the external device;

converts the first address assigning the entity that the external device is to, the first address being arbitrated to the second address; and accesses to the second address through at least one second controller of the one or more second controllers assigned by the information stored in the storing unit.

6. The logic verifying apparatus according to claim 5, wherein the second processor is an Input Output (IO) controller.

7. The logic verifying apparatus according to claim 1, wherein the second processor judges whether the first address indicating the entity that the second processor is to access is an address of the memory, and if the first address is judged to be the address of the memory, converts the first address to the second address.

8. The logic verifying apparatus according to claim 1, wherein the second processor judges whether the first address indicating the entity that the second processor is to access is an address of the memory;

if the first address is judged to be the address of the memory, judges, based on the information stored in the storing unit, whether the first address is an access to be converted; and if the first address is judged to be an address to be converted, converts the first address to the second address.

9. The logic verifying apparatus according to claim 1, wherein the information stored in the storing unit includes an association of a plurality of the first processors with the one or more second processors less in number than that of the first processors.

10. The logic verifying apparatus according to claim 1, wherein the second processor sets and changes the information stored in the storing unit.

11. A method for a logic verifying apparatus for carrying out logic verification on a system including a first processor and a plurality of first controllers that control a first access that the first processor makes to a memory, the access being made by the first processor using a verification model including a second processor corresponding to the first processor; and one or more second controllers corresponding to the first controllers, the one or more second controllers controlling a second access being made by the second processor to the memory, the method comprising:

converting, by the second processor, a first address indicating an entity that the second processor is to access through one second controller assigned by information that assigns the one or more of the second controllers that is to be used as the verification model stored in a storing unit, into a second address, such that the second processor access the memory, by converting one or more assigning address bits that assign the one second controller through which the second processor makes the access into a value indicating the one second controller assigned by the information stored in the storing unit, the number of the one or more second controllers being less than that of the first controllers; and interleaving-controlling, by the one second controller, the second access that the second processor makes to the memory, based on the values of one or more assigning address bits in the second address, wherein the converting of the address being performed by:

fixing at least one of the assigning address bits of the first address, wherein the assigning address bits are not the most significant bit of the first address, to a value of an assigned address bits that specifies the one second controller assigned by the information stored in the storing units;

discarding the number of bits which is reduced from the most significant bit of an address bit representing a memory region of the memory by fixing the at least one of the assigning address bits; and shifting, by the number of the discarded bits, bits in the first address indicates the entity that the first processor accesses between an address bit corresponding to a fixed pattern in the assigning address bits and a bit lower by the number of the discarded bits than the most significant bit.

12. The method according to claim 11, wherein the method comprising:

converting, by the second processor, the address by shifting bits of the address to the second address based on the information stored in the storing units and one or more assigning address bits that assign the one second controller through which the second processor makes the access and that is included in the first address.

13. The method according to claim 11, wherein the method comprising:

generating, by the second processor, the first address of the entity that the second processor is to access;

converting, by the second processor, the first address of the entity that the second processor is to access to the second address; and by the second processor, selecting the one second controller from the one or more second controllers assigned by the information stored in the storing unit based on the second address and accessing the second address converted by the converting unit through the one second controller selected.

14. The method according to claim 11, wherein the method comprising:

arbitrating, by the second processor, an access that at least one external device connected to the second processor is to make, based on the first address which indicates an entity that the external device is to access and which is issued from the external device;

converting, by the second processor, the first address assigning the entity that the external device is to, the first address being arbitrated to the second address; and accessing, by the second processor, to the second address through at least one second controller of the one or more second controllers assigned by the information stored in the storing unit.

15. The method according to claim 11, wherein the method comprising by the second processor, judging whether the first address indicating the entity that the second processor is to access is an address of the memory, and if the first address is judged to be the address of the memory, converting the first address to the second address.

16. The method according to claim 11, wherein the method comprising:

judging whether the first address indicating the entity that the second processor is to access is an address of the memory;

if the first address is judged to be the address of the memory, judging, based on the information stored in the storing unit, whether the first address is an access to be converted; and if the first address is judged to be an address to be converted, converting the first address to the second address.

17. The method according to claim 11, wherein the information stored in the storing unit includes an association of a plurality of the first processors with the one or more second processors less in number than that of the first processors.

18. The method according to claim 11, wherein the method comprising:

setting and changing, by the second processor, the information stored in the storing unit.

* * * * *